(12) United States Patent
Meinel et al.

(10) Patent No.: US 9,417,133 B2
(45) Date of Patent: *Aug. 16, 2016

(54) INFRARED SENSOR STRUCTURE AND METHOD

(71) Applicant: TEXAS INSTRUMENTS INCORPORATED, Dallas, TX (US)

(72) Inventors: Walter B. Meinel, Tucson, AZ (US); Kalin V. Lazarov, Colorado Springs, CO (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 184 days.

This patent is subject to a terminal disclaimer.

(21) Appl. No.: 14/073,636

(22) Filed: Nov. 6, 2013

(65) Prior Publication Data

US 2014/0131577 A1    May 15, 2014

Related U.S. Application Data

(63) Continuation of application No. 12/380,316, filed on Feb. 26, 2009, now Pat. No. 8,604,435.

(51) Int. Cl.
| | |
|---|---|
| *H01L 31/18* | (2006.01) |
| *G01J 5/12* | (2006.01) |
| *H01L 31/02* | (2006.01) |
| *H01L 27/146* | (2006.01) |
| *G01J 5/00* | (2006.01) |

(52) U.S. Cl.
CPC .............. *G01J 5/12* (2013.01); *H01L 27/14649* (2013.01); *H01L 31/02* (2013.01); *H01L 31/18* (2013.01); *G01J 2005/0048* (2013.01)

(58) Field of Classification Search
CPC ............. G01J 5/12; G01J 5/0225; G01J 5/34; G01J 5/345; G01J 2005/0048; H01L 27/14649; H01L 31/02; H01L 31/18; H01L 37/02; G03B 13/191
See application file for complete search history.

(56) References Cited

U.S. PATENT DOCUMENTS

| | | | |
|---|---|---|---|
| 4,481,403 A * | 11/1984 | Del Monte | ................... 219/209 |
| 5,589,689 A | 12/1996 | Koskinen | |
| 6,300,632 B1 | 10/2001 | Liu et al. | |
| 6,345,238 B1 | 2/2002 | Goodwin | |
| 6,673,593 B2 | 1/2004 | Mastromatteo et al. | |

(Continued)

OTHER PUBLICATIONS

Investigation of Thermopile Using CMOS Compatible Process and Front-Side Si Bulk Etching, SPIE, vol. 4176 (2000), pp. 168-178 (Du, et al.).

(Continued)

*Primary Examiner* — Casey Bryant
(74) *Attorney, Agent, or Firm* — Greogry J. Albin; Frank D. Cimino

(57) ABSTRACT

A radiation sensor (27) includes a radiation sensor chip (1) including first (7) and second (8) thermopile junctions connected to form a thermopile (7,8). The first thermopile junction is disposed in a floating portion of a dielectric membrane (3) thermally insulated from a silicon substrate (2) of the chip, and the second thermopile junction is disposed in the dielectric membrane directly adjacent to the substrate. Bump conductors (28) are bonded to corresponding bonding pads (28A) coupled to the thermopile (7,8) to physically and electrically connect the chip to conductors on a printed circuit board (23). The silicon substrate transmits infrared radiation to the thermopile while blocking visible light.

19 Claims, 14 Drawing Sheets

(56) References Cited

U.S. PATENT DOCUMENTS

| | | | |
|---|---|---|---|
| 6,677,654 B2 | 1/2004 | Kim et al. | |
| 6,787,052 B1 | 9/2004 | Vaganov | |
| 6,828,560 B2 | 12/2004 | Lambert et al. | |
| 7,754,517 B2 | 7/2010 | Linuma | |
| 2002/0148807 A1 | 10/2002 | Zhao et al. | |
| 2003/0146384 A1* | 8/2003 | Logsdon et al. | 250/338.1 |
| 2004/0113076 A1 | 6/2004 | Guo et al. | |
| 2005/0061980 A1* | 3/2005 | Iida et al. | 250/338.4 |
| 2005/0178574 A1* | 8/2005 | Noguchi et al. | 174/52.1 |
| 2005/0186751 A1 | 8/2005 | Beach et al. | |
| 2006/0062439 A1 | 3/2006 | Setlak | |
| 2006/0238292 A1 | 10/2006 | Beach et al. | |
| 2007/0298534 A1 | 12/2007 | Ikushima et al. | |
| 2008/0048298 A1 | 2/2008 | Taylor et al. | |
| 2008/0179503 A1 | 7/2008 | Camargo et al. | |
| 2008/0317087 A1* | 12/2008 | Kimura | 374/1 |
| 2009/0134330 A1 | 5/2009 | Huppertz | |
| 2010/0213373 A1 | 8/2010 | Meinel et al. | |
| 2010/0289108 A1 | 11/2010 | Meinel et al. | |
| 2010/0327393 A1 | 12/2010 | Meinel et al. | |
| 2011/0147869 A1 | 6/2011 | Lazarov et al. | |
| 2012/0061570 A1* | 3/2012 | Meinel et al. | 250/338.4 |

OTHER PUBLICATIONS

"MLX90614 Family: Single and Dual Zone Infra Red Thermometer in TO-39,"Data Sheet, Jul. 30, 2008, pp. 1-42 (Microelectronic Integrated Systems (Melexis)).

"Micro-Heater on Membrane with Large Uniform-Temperature Area," IEEE Sensors 2006, EXCO, Daegu, Korea / Oct. 22-25, 2006, pp. 571-575 (Li, et al.).

"Layer," Webster New College Dictionary, Wiley Publishing, 2005.

"Layer," Jun. 22, 2013 at http://dictionary.reference.com/browse/layer?s=t&path=/.

"Stratum," Webster New College Dictionary, Wiley Publishing, 2005.

"Stratum," Jun. 22, 2013 at http://dictionary.reference.com/browse/stratum?&path=/.

Roncaglia et al., "CMOS-Compatible Fabrication of Thermopiles with High Sensitivity in the 3-5 μm Atmospheric Window," Sensors and Actuators B: Chemical 125 (1), 2007, pp. 214-223.

* cited by examiner $$V_{out} = (T_1 - T_2)(S_1 - S_2)$$

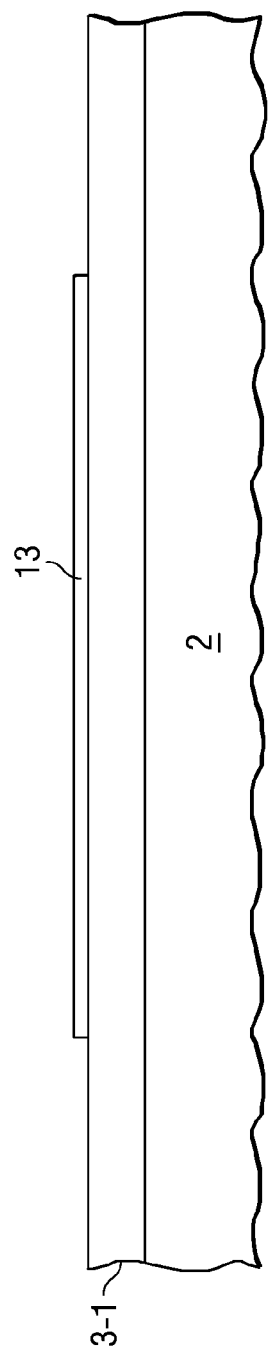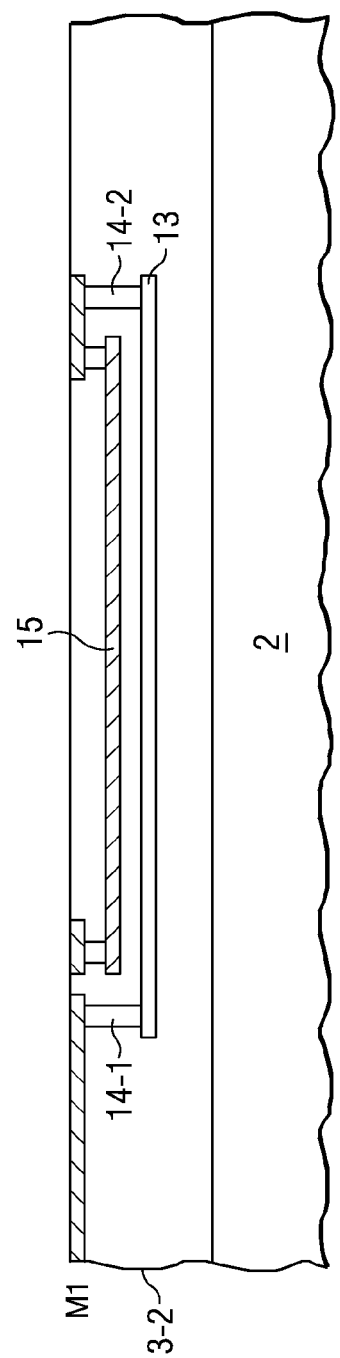

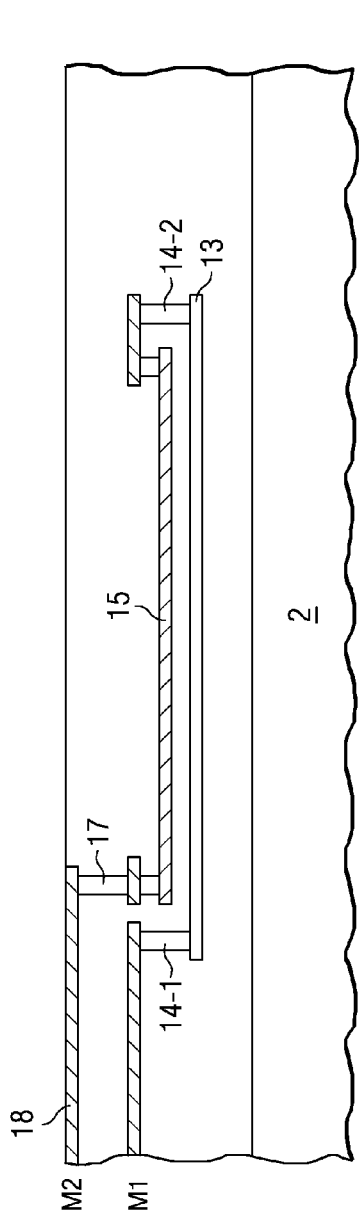
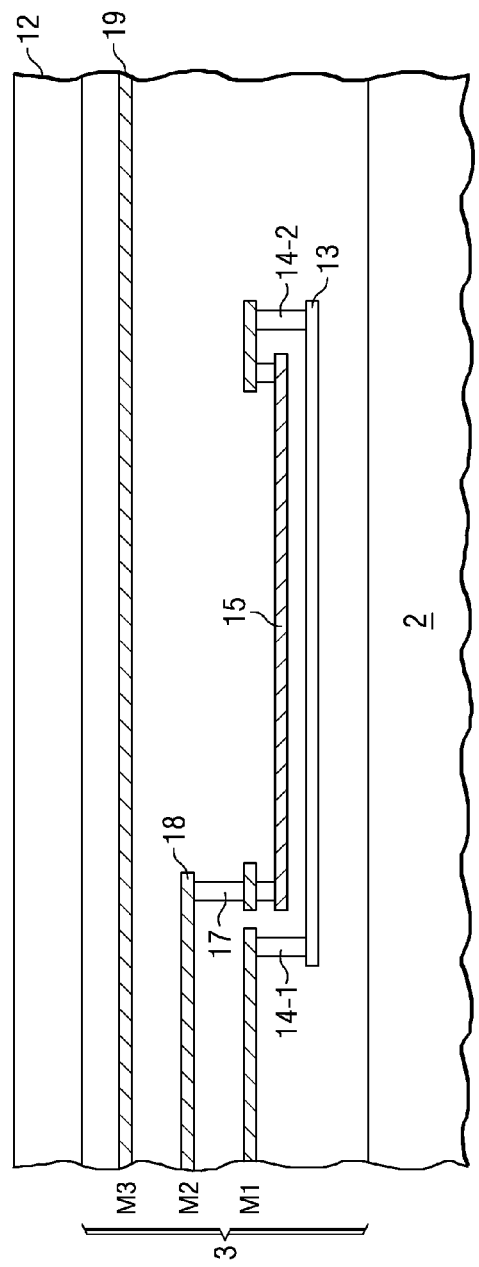

INFRARED SENSOR STRUCTURE AND METHOD

CROSS-REFERENCE TO RELATED APPLICATION(S)

This application is a continuation of application Ser. No. 12/380,316, filed Feb. 26, 2009 (now U.S. Pat. No. 8,604,435), the entirety of which is herein incorporated by reference.

BACKGROUND OF THE INVENTION

This invention is related to the assignee's co-pending applications:
  Ser. No. 12/380,318, which is entitled "ON-CHIP CALIBRATION SYSTEM AND METHOD FOR INFRARED SENSOR" and filed Feb. 26, 2009;
  Ser. No. 12/456,910, entitled "METHOD AND STRUCTURES FOR ETCHING CAVITY IN SILICON UNDER DIELECTRIC MEMBRANE" and filed on Jun. 24, 2009;
  Ser. No. 12/454,257 (now U.S. Pat. No. 8,026,177), which is entitled "SILICON DIOXIDE CANTILEVER SUPPORT AND METHOD FOR SILICON ETCHED STRUCTURES" and filed on May 14, 2009;
  Ser. No. 13/208,130, which is entitled "SILICON DIOXIDE CANTILEVER SUPPORT AND METHOD FOR SILICON ETCHED STRUCTURES" and filed on Aug. 11, 2011; and
  Ser. No. 13/208,098, which is entitled "SILICON DIOXIDE CANTILEVER SUPPORT AND METHOD FOR SILICON ETCHED STRUCTURES" and filed on Aug. 11, 2011.

The present invention relates generally to various semiconductor-processing-compatible infrared (IR) sensor structures and fabrication methods, and more particularly to improved IR radiation sensing structures and processes which reduce size and cost of IR sensors and which provide smaller, more economical, more sensitive IR radiation intensity measurements.

The closest prior art is believed to include the article "Investigation Of Thermopile Using CMOS Compatible Process and Front-Side Si Bulk Etching" by Chen-Hsun-Du and Chengkuo Lee, Proceedings of SPIE Vol. 4176 (2000), pp. 168-178, incorporated herein by reference. Infrared thermopile sensor physics and measurement of IR radiation using thermopiles are described in detail in this reference. Prior Art FIG. 1 herein shows the CMOS-processing-compatible IR sensor integrated circuit chip in FIG. 1 of the foregoing article. "Prior Art" FIG. 1 herein is similar to that drawing.

Referring to Prior Art FIG. 1 herein, the IR sensor chip includes a silicon substrate 2 having a CMOS-processing-compatible dielectric ($SiO_2$) stack 3 thereon including a number of distinct sub-layers. A N-type polysilicon (polycrystalline silicon) trace 11 and an aluminum trace M1 in dielectric stack 3 form a first "thermopile junction" where the polysilicon trace and the aluminum trace are joined. Additional oxide layers and additional metal traces also may be included in dielectric stack 3. An oxide passivation layer 12A is formed on top of dielectric stack 3, and a nitride passivation layer 12B is formed on oxide passivation layer 12A. A number of silicon etchant openings 24 extend through nitride passivation layer 12 and dielectric stack 3 to the top surface of silicon substrate 2 and are used to etch a cavity 4 in silicon substrate 2 underneath the portion of dielectric stack 3 in which the thermopile is formed, to thermally isolate it from silicon substrate 2.

A second thermopile junction (not shown) is also formed in dielectric stack 3 but is not thermally isolated from silicon substrate 2 and therefore is at the same temperature as silicon substrate 2. The temperatures of the first and second thermopile junctions are designated T1 and T2, respectively. The first and second thermopile junctions are connected in series and form a single "thermopile". The various silicon etchant openings 24 are formed in regions in which there are no polysilicon or aluminum traces, as shown in the dark areas in FIG. 2 of the Du and Lee article.

Incoming IR radiation indicated by arrows 5 in Prior Art FIG. 1 impinges on the "front side" or "active surface" of the IR sensor chip. (The "back side" of the chip is the bottom surface of silicon substrate 2 as it appears in Prior Art FIG. 1.) The incoming IR radiation 5 causes the temperature of the thermopile junction supported on the "floating" portion of dielectric membrane 3 located directly above cavity 4 to be greater than the temperature of the second thermopile junction (not shown) in dielectric membrane 3 which is not insulated by cavity 4.

The IR radiation sensor in Prior Art FIG. 1 measures the temperature difference T1–T2 and produces an output voltage proportional to that temperature difference. The aluminum trace and N-type polycrystalline silicon trace of which the first and second thermopile junctions are formed both are available in a typical standard CMOS wafer fabrication process.

A polycrystalline silicon heater is shown in FIG. 2 of the Du and Lee article, and is described as providing a given bias leading to thermopile power generation used to characterize the thermal conductance and capacitance of the thermopile membrane materials.

The prior art laboratory approach to calibrating thermopile responsivity requires a previously calibrated infrared radiation source. The IR sensor is illuminated by a known IR source, and the resulting value of Vout is measured. Then a somewhat complicated calculation of the infrared power being absorbed by the thermopile is performed in order to determine the responsivity in volts per watt. The prior art calibration procedure is very sensitive to the equipment set-up and to the variances and accuracy of the various components of the equipment set-up.

The Du and Lee article describes the IR sensor mounted inside a metal package having a window through which ambient IR radiation passes to reach the thermopile in the packaged IR sensor chip. The IR sensor chip described in the Du and Lee article is not believed to have ever been commercially available.

The prior art also includes the commercially available MLX90614 family of IR radiation sensors marketed by Melexis Microelectronic Integrated Systems. These devices are packaged in metal TO-39 packages having windows through which impinging IR radiation can pass in order to reach the packaged IR sensors.

The above described prior art IR sensors require large, expensive packages. The foregoing prior art IR radiation sensors need to block visible light while transmitting IR radiation to the thermopiles in order to prevent false IR radiation intensity measurements due to ambient visible lighting conditions. To accomplish this, the packages typically have a silicon window or a window with baffles. Furthermore, the "floating" portion of dielectric membrane over cavity 4 in Prior Art FIG. 1 is quite fragile. In many of the prior art IR sensors, the silicon cavity is etched from the "back side" of the silicon wafer. This creates a large opening span that is difficult to protect.

It would be highly desirable to provide smaller, more economical, and more robust IR sensors than are known in the prior art for various applications such as non-contact measurement of temperature and remote measurement gas concentrations. It is believed that many markets would be very receptive to substantially smaller, substantially more economical IR radiation sensor devices than those of the prior art.

Thus, there is an unmet need for an IR radiation sensor which is substantially smaller and less expensive than the IR radiation sensors of the prior art.

There also is an unmet need for a more accurate IR radiation sensor than has been found in the prior art.

There also is an unmet need for an IR radiation sensor which provides more sensitive, more accurate measurement of IR radiation than the IR radiation sensors of the prior art.

There also is an unmet need for a CMOS-processing-compatible IR radiation sensor chip which does not need to be packaged in a relatively large, expensive package having a window.

There also is an unmet need for a CMOS-processing-compatible IR radiation sensor chip which is substantially more robust than those of the prior art.

There also is an unmet need for an improved method of fabricating an infrared radiation sensor.

There also is an unmet need for an improved method of fabricating a CMOS-processing-compatible IR sensor device which does not require bonding the CMOS-processing-compatible IR sensor chip in a relatively large, expensive package having an infrared window therein.

SUMMARY OF THE INVENTION

It is an object of the invention to provide an IR radiation sensor which is substantially smaller and less expensive than the IR radiation sensors of the prior art.

It is another object of the invention to provide a more accurate IR radiation sensor than has been found in the prior art.

It is another object of the invention to provide an IR radiation sensor which provides more sensitive, more accurate measurement of IR radiation than the IR radiation sensors of the prior art.

It is another object of the invention to provide an IR radiation sensor chip which does not need to be packaged in a relatively large, expensive package having an infrared window.

It is another object of the invention to provide an IR radiation sensor chip which is substantially more robust than those of the prior art.

It is another object of the invention to provide an improved method of fabricating an infrared radiation sensor.

It is another object of the invention to provide an improved method of fabricating a CMOS-processing-compatible IR sensor device which does not require packaging the CMOS-processing-compatible IR sensor chip in a relatively large, expensive package having a window therein.

It is another object of the invention to provide an improved method of fabricating an IR sensor device which is more robust than those of the prior art.

Briefly described, and in accordance with one embodiment, the present invention provides a radiation sensor (27) which includes a radiation sensor chip (1) including first (7) and second (8) thermopile junctions connected to form a thermopile (7,8). The first thermopile junction is disposed in a floating portion of a dielectric membrane (3) thermally insulated from a silicon substrate (2) of the chip, and the second thermopile junction is disposed in the dielectric membrane directly adjacent to the substrate. Bump conductors (28) are bonded to corresponding bonding pads (28A) coupled to the thermopile (7,8) to physically and electrically connect the chip to conductors on a printed circuit board (23). The silicon substrate transmits IR radiation to the thermopile while blocking visible light.

In one embodiment, the invention provides a radiation sensor device (27) which includes an integrated circuit radiation sensor chip (1) including first (7) and second (8) thermopile junctions connected in series to form a thermopile (7,8) within a dielectric stack (3) of the radiation sensor chip (1). A first thermopile junction (7) is more thermally insulated from a substrate (2) of the radiation sensor chip (1) than the second thermopile junction (8). A plurality of bonding pads (28A) on the radiation sensor chip (1) are coupled to the thermopile (7,8). A plurality of bump conductors (28) are bonded to the bonding pads (28A), respectively, to physically and electrically connect the radiation sensor chip (1) to conductors on a printed circuit board (23), and no chip coating material blocks radiation to be sensed by the radiation sensor device (27). In the described embodiments, the first thermopile junction (7) is insulated from the substrate (2) by means of a cavity (4) between the substrate (2) and the dielectric stack (3). In a described embodiment, the dielectric stack (3) is a CMOS semiconductor process dielectric stack including a plurality of $SiO_2$ sublayers (3-1,2 . . . 6) and various polysilicon traces, titanium nitride traces, tungsten contacts, and aluminum metallization traces between the various sublayers patterned to provide the first (7) and second (8) thermopile junctions connected in series to form the thermopile (7,8). Each of the first (7) and second (8) thermopile junctions is composed of a plurality of thermopile junctions connected in series, respectively.

In a described embodiment, CMOS circuitry (45) is coupled between first (+) and second (−) terminals of the thermopile (7,8) to receive and operate on a thermoelectric voltage (Vout) generated by the thermopile (7,8) in response to infrared (IR) radiation received by the radiation sensor chip (1), the CMOS circuitry also being coupled to the bonding pads (28A).

In one embodiment, a gain and filter circuit (45A) amplifies and filters the output voltage (Vout) produced between the first (+) and second (−) terminals. In another embodiment, an amplifier (44) has an input selectively coupled to receive the voltage (Vout) and an output of a local temperature circuit (56). An output of the amplifier (44) is coupled to an input of a delta-sigma analog-to-digital converter (55). The delta-sigma analog-to-digital converter (55) has an output (58) coupled to an input of a digital interpolator (59) for linearizing an output signal produced by the delta-sigma analog-to-digital converter (55).

In the described embodiments, the substrate (2) is composed of silicon to pass infrared radiation to the thermopile (7,8) and block visible radiation. A passivation layer (12) is disposed on the dielectric stack (3). Of plurality of generally circular etchant openings (24) are located between the various traces and extend through the passivation layer (12) and the dielectric layer (3) to the cavity (4) for introducing silicon etchant to etch the cavity (4) into the silicon substrate (2). A cap layer (34) is disposed on the passivation layer (12) to cover the etchant openings (24) to protect the cavity (4) from contamination and to reinforce a portion of the dielectric stack (3) spanning the cavity (4). In the described embodiment, the passivation layer (12) is composed of silicon nitride and the cap layer (34) is composed of roll-on epoxy film material and is of substantially greater thickness than the dielectric stack (3).

In one embodiment, the invention provides a method for making a radiation sensor device (27), including providing first (7) and second (8) thermopile junctions connected in series in a dielectric stack (3) of a radiation sensor chip (1) to form a thermopile (7,8), and thermally insulating the first thermopile junction (7) from a substrate (2) of the radiation sensor chip (1), forming a plurality of bonding pads (28A) on the radiation sensor chip (1), the bonding pads (28A) being coupled to the thermopile (7,8), and bonding a plurality of bump conductors (28) to the bonding pads (28A), respectively, to physically and electrically connect the radiation sensor chip (1) to conductors on a printed circuit board (23). In the described embodiment, the first thermopile junction (7) is insulated from the substrate (2) by etching a cavity (4) in the substrate (2) between the first thermopile junction (7) and the substrate (2). The method includes coupling the thermopile (7,8) between first (11A) and second (11B) terminals of CMOS circuitry (45) included in the radiation sensor chip (1) for receiving and operating upon a thermoelectric voltage (Vout) generated by the thermopile (7,8) in response to radiation received by the sensor chip (1).

Any described embodiment, the dielectric stack (3) is a CMOS process dielectric stack including a plurality of $SiO_2$ sublayers (3-1,2...6) and various polysilicon traces, titanium nitride traces, tungsten contacts, and aluminum metallization traces between the various sublayers patterned to provide the first (8) and second (7) thermopile junctions connected in series, and wherein the substrate (2) is composed of silicon, wherein the method includes forming a passivation layer (12) on the dielectric stack (3), forming a plurality of etchant openings (24) located between the various traces and extending through the passivation layer (12) and the dielectric layer (3) to the cavity (4), introducing silicon etchant through the etchant openings (24) to etch the cavity (4) into the substrate (2), and forming a cap layer (34) on the passivation layer (12) to cover the etchant openings (24) to protect the cavity (4) from contamination and to reinforce a portion of the dielectric stack (3) spanning the cavity (4) by rolling epoxy film material onto the passivation layer (12), the cap layer (34) being sufficiently thick and strong to substantially reinforce the portion of the dielectric stack (3) spanning the cavity (4). A gain and filter amplifier circuit (45A) is provided to amplify and filter the output voltage (Vout) produced between the first (11A) and second (11B) terminals in the CMOS circuitry (45).

In one embodiment, the invention provides a radiation sensor device (27) including a radiation sensor chip (1) including first (7) and second (8) thermopile junctions connected in series in a dielectric stack (3) of the radiation sensor chip (1) to form a thermopile (7,8), means (4) for thermally insulating the first thermopile junction (7) from a substrate (2) of the radiation sensor chip (1), and bump conductor means (28) bonded to a plurality of bonding pads (28A) coupled to the thermopile (7,8), respectively, for physically and electrically connecting the radiation sensor chip (1) to conductors of the printed circuit board (23).

BRIEF DESCRIPTION OF THE DRAWINGS

FIGS. 10A-10G show a sequence of section view diagrams of the IR sensor structures generated according to the process for fabricating the IR sensor chip of FIG. 3A.

DETAILED DESCRIPTION OF THE PREFERRED EMBODIMENTS

Figure 1:
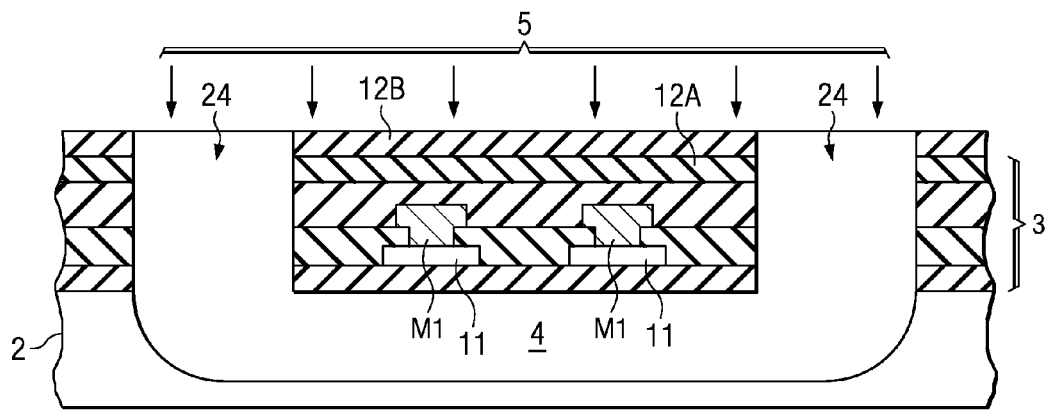
FIG. 1 is a section view diagram of a prior art IR radiation detector supported in a membrane formed in a CMOS-processing-compatible process.
Figure 2:
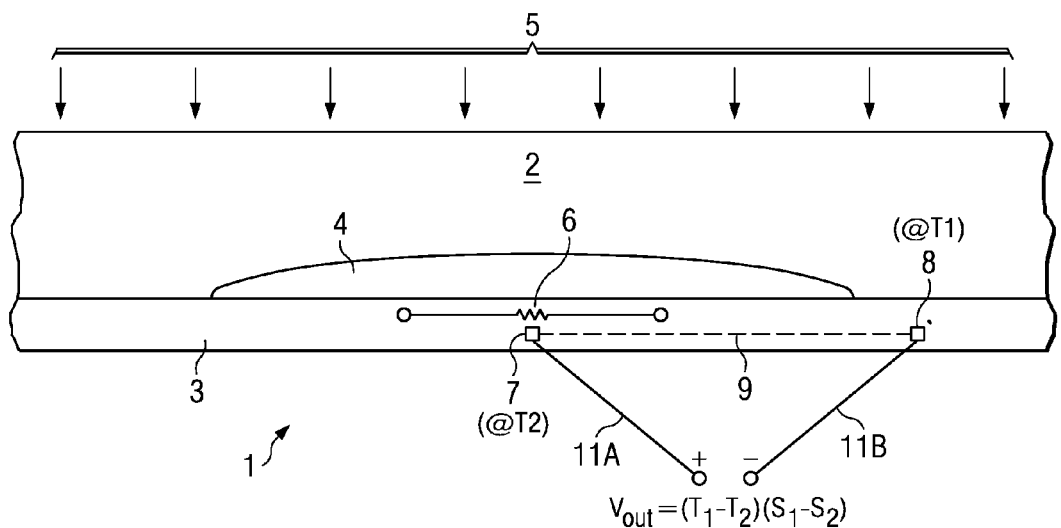
FIG. 2 is a generalized section view diagram illustrating use of an internal heater element to facilitate field calibration of an IR radiation detector such as the one shown in Prior Art FIG. 1.

FIG. 2 shows a schematic representation of a IR sensor chip 1 of the present invention, with the sensor chip 1 inverted relative to the orientation shown in FIG. 1. In FIG. 2, IR detector chip 1 includes silicon substrate 2 in which cavity 4 is formed. A conventional CMOS-processing-compatible $SiO_2$ dielectric stack 3 is formed on the lower surface of silicon substrate 2. The upward-oriented back surface of silicon substrate 2 receives IR radiation 5 and passes it through to $SiO_2$ stack 3 while filtering out any ambient visible light. $SiO_2$ stack 3 may contain various aluminum traces, polysilicon traces, and various other traces and metal contacts that are available in some conventional CMOS wafer fabrication processes. A first thermopile junction 7 is formed by dissimilar materials within dielectric stack 3 adjacent to cavity 4, and is thermally insulated, by cavity 4, from silicon substrate 2. A second thermopile junction 8 is formed by dissimilar materials within dielectric stack 3 adjacent to the lower surface of silicon substrate 2. Thermopile junctions 7 and 8 are connected in series, as indicated by dashed line 9, to form a thermopile 7,8. The terminals of thermopile 7,8 are schematically represented by conductors 11A and 11B.

The portion of $SiO_2$ stack 3 spanning the opening of cavity 4 forms a thin "floating" membrane which supports thermopile junction 7, and also supports a resistive heater 6 if one is used. IR radiation 5 impinges uniformly on the upper surface of silicon substrate 2, differentially heating both of thermopile junctions 7 and 8. This results in the temperature T1 of thermopile junction 7 and the temperature T2 of thermopile junction 8 being different because of the insulative or thermal resistance properties of cavity 4. The thermoelectric output voltage difference Vout between thermopile terminals 11A and 11B in FIG. 2 is generally indicated by the simplified expression $$V\text{out}=(T1-T2)(S1-S2),$$

where T1−T2 is the temperature difference between the two thermopile junctions 7 and 8, and where S1 and S2 are the Seebeck coefficients of thermopile 7,8. Different materials have different Seebeck coefficients. The Seebeck coefficient of a thermopile is a measured physical constant that is a function of the difference between the polysilicon and aluminum materials of which the thermopile is composed. Each of the polysilicon material and the aluminum material has its own Seebeck coefficient, the polysilicon having the higher Seebeck coefficient. The difference in the Seebeck coefficients of the polysilicon and the aluminum, multiplied by the temperature difference T1−T2, is the output voltage Vout of the series-connected poly/aluminum thermopile junctions 7 and 8 which form thermopile 7,8.

A resistive heater 6 may be formed within $SiO_2$ stack 3, for the purpose of facilitating convenient field calibration of the responsivity of thermopile 7,8, wherein the responsivity is defined as the output signal (Vout) in volts per watt of power absorbed by thermopile 7,8 Note that heater 6 is unlike the heater shown in FIG. 2 of the Du and Lee article, which is used for characterizing heat conductance and capacitance in the floating thermopile membrane over the cavity of the IR sensor structure.

Figure 3A:
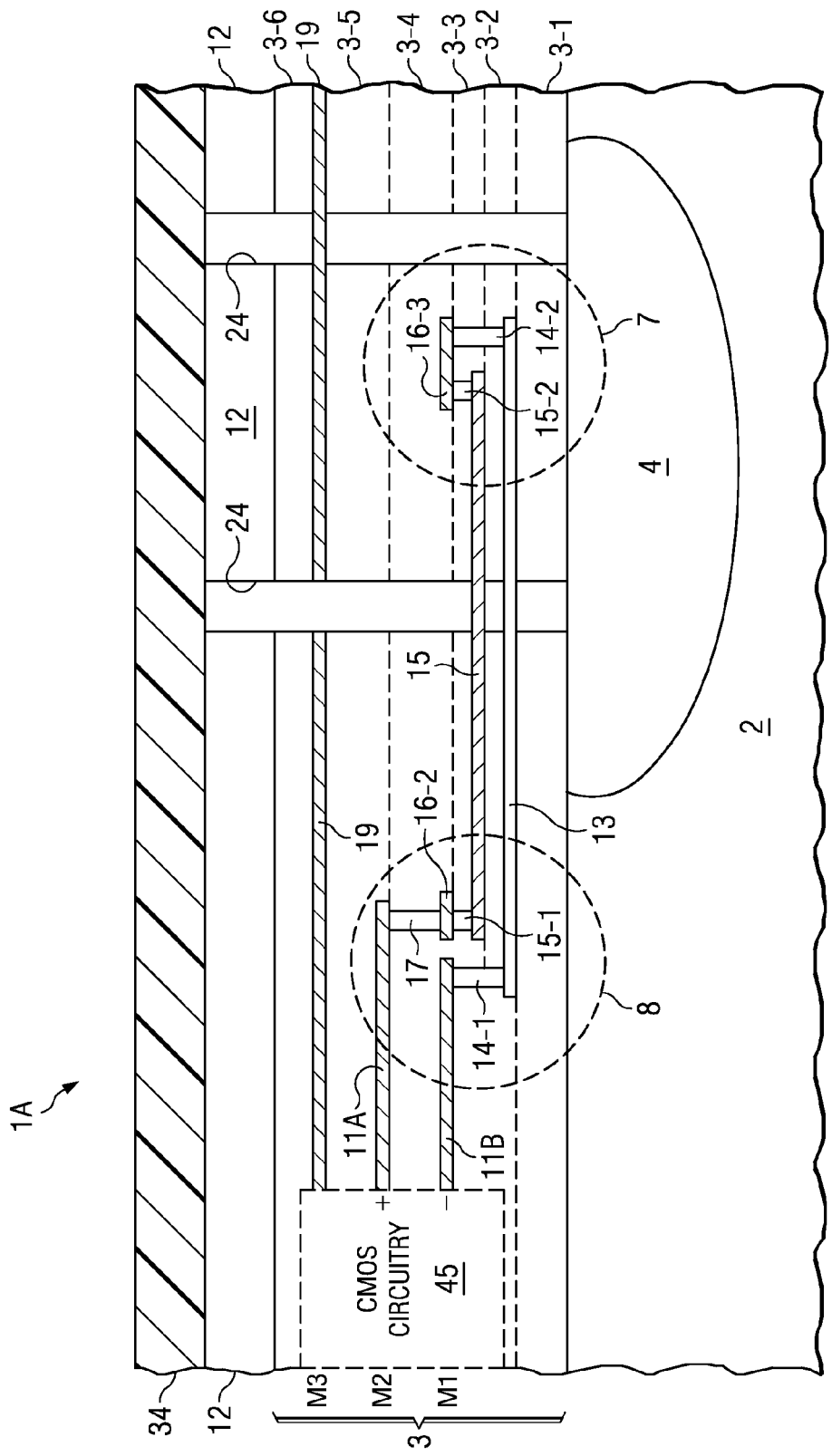
FIG. 3A is a section view of a CMOS-processing-compatible IR sensor chip according to the present invention.

FIG. 3A shows a cross-section of an integrated circuit IR sensor chip 1 which includes silicon substrate 2 and cavity 4 therein, generally as shown in FIG. 2 except that chip 1 is inverted. Silicon substrate 2 includes a thin layer (not shown) of epitaxial silicon into which cavity 4 is etched, and also includes the silicon wafer substrate on which the original epitaxial silicon layer is grown. IR sensor chip 1 includes $SiO_2$ stack 3 formed on the upper surface of silicon substrate 2. $SiO_2$ stack 3 includes multiple oxide layers 3-1,2 . . . 6 as required to facilitate fabrication within $SiO_2$ stack 3 of N-doped polysilicon layer 13, titanium nitride layer 15, tungsten contact layers 14-1, 14-2, 15-1, 15-2, and 17, first aluminum metallization layer M1, second aluminum metallization layer M2, third aluminum metallization layer M3, and various elements of CMOS circuitry in block 45. (Note however, that in some cases it may be economic and/or practical to provide only thermopile 7,8 on IR sensor chip 1 and provide all signal amplification, filtering, and/or digital or mixed signal processing on a separate chip or chips.)

The various layers shown in dielectric stack 3, including polysilicon layer 13, titanium nitride layer 15, aluminum first metallization layer M1, aluminum second metallization layer M2, and aluminum third metallization layer M3 each are formed on a corresponding oxide sub-layer of dielectric stack 3. Thermopile 7,8 thus is formed within $SiO_2$ stack 3. Cavity 4 in silicon substrate 2 is located directly beneath thermopile junction 7, and therefore thermally insulates thermopile junction 7 from silicon substrate 2. However thermopile junction 8 is located directly adjacent to silicon substrate 2 and therefore is at essentially the same temperature as silicon substrate 2. A relatively long, narrow polysilicon trace 13 is disposed on a $SiO_2$ sub-layer 3-1 of dielectric stack 3 and extends between tungsten contact 14-2 (in thermopile junction 7) and tungsten contact 14-1 (in thermopile junction 8). Titanium nitride trace 15 extends between tungsten contact 15-1 (in thermopile junction 8) and tungsten contact 15-2 (in thermopile junction 7). Thus, polysilicon trace 13 and titanium nitride trace 15 both function as parts of thermopile 7,8. Thermopile 7,8 is referred to as a poly/titanium-nitride thermopile, since the Seebeck coefficients of the various aluminum traces cancel and the Seebeck coefficients of the various tungsten contacts 14-1, 14-2, 15-2, and 17 also cancel because the temperature difference across the various connections is essentially equal to zero.

The right end of polysilicon layer 13 is connected to the right end of titanium nitride trace 15 by means of tungsten contact 14-2, aluminum trace 16-3, and tungsten contact 15-2 so as to form "hot" thermopile junction 7. Similarly, the left end of polysilicon layer 13 is connected by tungsten contact 14-1 to aluminum trace 11B and the left end of titanium nitride trace 15 is coupled by tungsten contact 15-1, aluminum trace 16-2, and tungsten contact 17 to aluminum trace 11A, so as to thereby form "cold" thermopile junction 8. The series-connected combination of the two thermopile junctions 7 and 8 forms thermopile 7,8.

Aluminum metallization interconnect layers M1, M2, and M3 are formed on the $SiO_2$ sub-layers 3-3, 3-4, and 3-5, respectively, of dielectric stack 3. A conventional silicon nitride passivation layer 12 is formed on another oxide sub-layer 3-6 of dielectric layer 3. A number of relatively small-diameter etchant holes 24 extend from the top of passivation layer 12 through dielectric stack 3 into cavity 4, between the various patterned metallization (M1, M2 and M3), titanium nitride, and polysilicon traces which form thermopile junctions 7 and 8. As subsequently explained, silicon etchant is introduced through etchant holes 24 to etch cavity 4 into the upper surface of silicon substrate 2. Note that providing the etchant openings 24 is not conventional in standard CMOS processing or bipolar integrated circuit processing, nor is the foregoing silicon etching used in this manner in standard CMOS processing or bipolar integrated circuit processing.

The small diameters of etchant holes 24 are selected in order to provide a more robust floating thermopile membrane, and hence a more robust IR radiation sensor. The diameters of the etchant hole openings 24 can vary from 10 microns to 30 microns with a spacing ratio of 3:1 maximum to 1:1. The spacings between the various etchant openings 24 can be in a range from approximately 10 to 60 microns. The smaller spacing ratio (i.e., the distance between the edges of the holes divided by the diameter of the holes) has the disadvantage that it results in lower total thermopile responsivity, due to the packing factor (the number of thermopile junctions per square millimeter of surface area) of the many thermopile junctions (see FIGS. 6, 7A and 7B) of which thermopile junctions 7 and 8 are composed, respectively. However, a smaller spacing ratio results in a substantially faster silicon etching time. Therefore, there is a trade-off between the robustness of the membrane and the cost of etching of cavity 4.

In accordance with the described embodiments of the invention, a roll-on epoxy film 34 is provided on nitride passivation layer 12 to permanently seal the upper ends of etch openings 24 and to reinforce the "floating membrane" portion of dielectric layer 3. Although there may be some applications of the invention which do not require epoxy cover plate 34, the use of epoxy cover plate 34 is an important aspect of providing a reliable WCSP package configuration of the IR sensors of the present invention. In an embodiment of the invention under development, epoxy cover plate 34 is substantially thicker (roughly 16 microns) than the entire thickness (roughly 6 microns) of dielectric stack 3.

Figure 4:
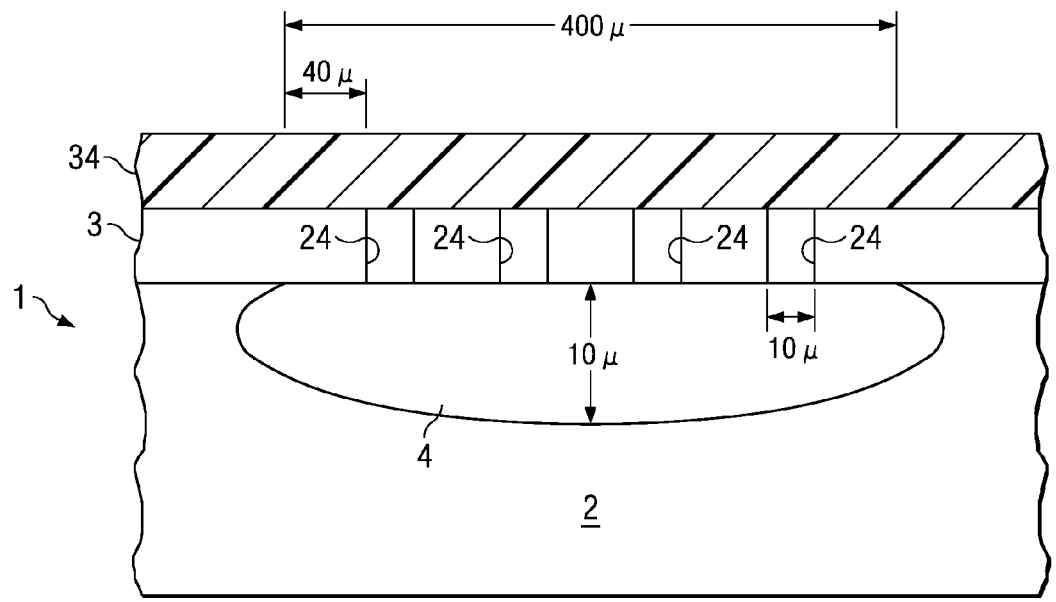
FIG. 4 is a more generalized section view diagram of the IR sensor of FIG. 3A, indicating various minimum dimensions of one embodiment thereof.

FIG. 4 illustrates minimum dimensions, in microns, of the various features of cavity 4 and the "floating" membrane portion of dielectric layer 3 which supports thermopile junction 7 above cavity 4, for an embodiment of the invention presently under development. In that embodiment the etchant openings are at least 10 microns (g) in diameter and are spaced at least approximately 10µ apart. The span of cavity 4 is typically 400µ, and its depth is at least 10µ.

The titanium nitride is used instead of aluminum because titanium nitride has lower thermal conductivity than aluminum. The higher thermal conductivity of aluminum causes it to provide a thermal path that lowers the responsivity of the IR sensor. Using the titanium nitride instead of aluminum helps to minimize the thermal conductivity and also helps to maximize the Seebeck response by increasing the T1−T2 temperature difference of the thermopile junction 7 in FIG. 3A. (In some standard CMOS processes, the titanium nitride is used for the top layer of the polysilicon/titanium nitride capacitor and also is used for connection to sichrome resistors.) Since thermopile junctions 7 and 8 are connected in series, the Seebeck coefficient of one is subtracted from the Seebeck coefficient of the other. Since there are two aluminum connections in thermopile 7,8, the Seebeck coefficients of the polysilicon and the titanium nitride materials of which thermopile 7,8 is composed are summed algebraically to obtain the net Seebeck coefficient between the titanium nitride and the polysilicon in thermopile 7,8 and the Seebeck coefficients of the aluminum connections cancel. The net Seebeck coefficient is a fairly large, easy-to-measure voltage, typically between 1 µV (microvolt) and 1 mV (millivolt). That voltage is multiplied by the temperature difference T1−T2 between thermopile junctions 7 and 8 to generate the value of Vout according to the previously indicated equation. Typically, many thermopile junctions (e.g. 200-300 or more) are connected in series in order to provide a thermopile having greater responsivity (i.e., larger output voltage).

The differential voltage Vout generated between (−) conductor 11B and (+) conductor 11A can be applied to the input of the CMOS circuitry in block 45. Block 45 can include the gain/filter amplifier 45A in FIG. 8 or some or all of the "mixed signal" circuitry 45B shown FIG. 9A.

Figure 3B:
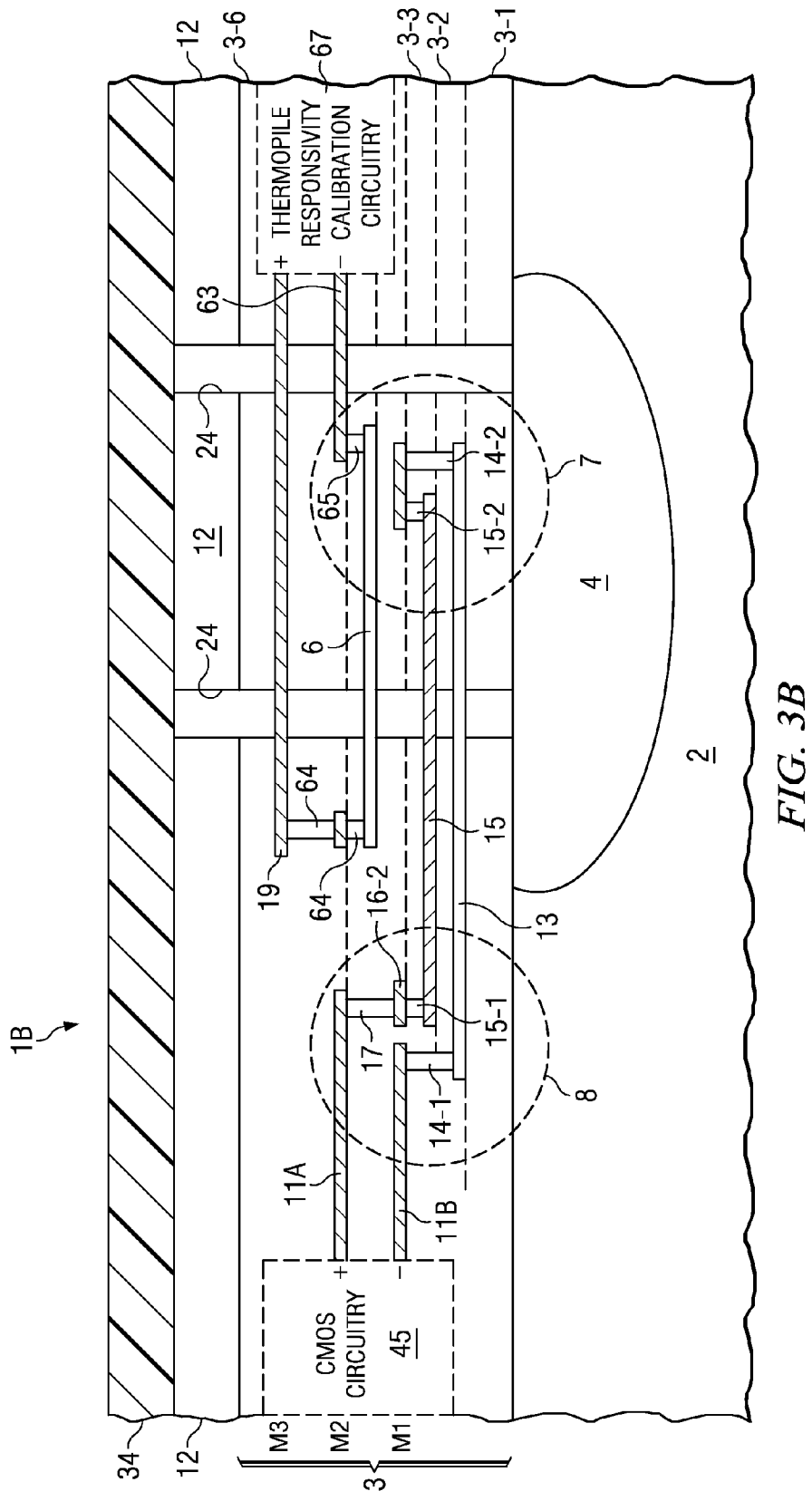
FIG. 3B is a section view of a CMOS-processing-compatible IR sensor chip further including an internal sichrome heater and calibration circuitry for calibrating the thermopile in the chip.

Referring to FIG. 3B, IR sensor chip 1B is the same as chip 1A in FIG. 3A except that an internal resistive sichrome (SiCr) heater 6 has been included in SiO$_2$ stack 3 directly above cavity 4 and thermopile junction 7. Sichrome heater 6 is formed by elongated sichrome trace 6, which is disposed on a SiO$_2$ sublayer between the M1 and M2 metallization layers. The right end of sichrome trace 6 is connected by tungsten contact 65 to an aluminum trace 63 of the M2 metallization layer to form a (−) terminal of CMOS thermopile responsivity calibration circuitry in block 67, various parts of which are included in silicon substrate 2. The left end of sichrome trace 6 is coupled by a pair of tungsten contacts 64 and an aluminum trace of the M2 metallization layer to the left end of an aluminum trace 19 of the M3 metallization layer to form a (+) terminal of the thermopile responsivity calibration circuitry in block 67. (Alternatively, resistive heater 6 could be composed of polycrystalline silicon or other resistive material instead of sichrome.)

Figure 3C:
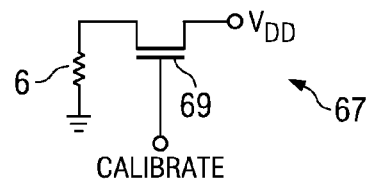
FIG. 3C is a calibration circuit of FIG. 3B.

Subsequently described FIG. 9A in part shows a simplified diagram of responsivity calibration circuitry including a switch 69 of FIG. 3C such as may be found in FIG. 3B, controlled by a signal CALIBRATE that connects one terminal of sichrome heater 6 to a reference voltage V+, the other terminal of sichrome heater 6 being connected by conductor 66 to one terminal of a current source 50, the other terminal of which is connected to ground. The signal CALIBRATE turns on switch 69 at least long enough for thermal equilibrium to be established between heating element 6 and thermopile junction 7, typically at least a number of milliseconds. Current source 50 determines the amount of current flowing through sichrome heater 6. The upper terminal 68 of sichrome heater 6 is connected to another terminal of switch 51, and the lower terminal 66 of sichrome heater 6 is connected to another terminal of switch S2. Therefore, delta-sigma ADC 55 functions as a high-impedance voltmeter when the pole terminals of single-pole, triple throw switches S1 and S2 are connected to conductors 68 and 66, respectively. Therefore, the known current through current source 50 can be multiplied by the voltage across sichrome heater 6 during the calibration process to compute the power dissipated in sichrome heater 6 and hence also absorbed by thermopile junction 7.

Circuitry included in block 67 of FIG. 3B uses digital values produced by ADC 55 and subsequently described digital interpolator 59 to multiply the voltage across sichrome heater 6 by the current in current source 50 to obtain the power dissipation (in watts) and uses that information to determine a responsivity calibration factor. That calibration factor is used as a scale factor in digital interpolator 59. The above mentioned multiplication occurs within digital interpolator 59.

The purpose of the responsivity calibration process is to establish Vout as a function of the number of watts being dissipated in thermopile 7,8. The responsivity of thermopile 7,8 is the number of volts (Vout) generated by the thermopile 7,8 divided by the amount of power in watts being dissipated therein. The value of Vout in volts is obtained from the measurement of Vout produced by thermopile 7,8. Since sichrome heater 6 and the calibration circuitry in block 67 are embedded in infrared sensor chip 1, there is no variance from one responsivity calibration operation to the next. In contrast, the previously described prior art calibration procedure is much more sensitive to the equipment set-up and variances in accuracy of the various components of the equipment set-up. The accuracy of the measurement of current and resistance is greater than 0.01%.

Note that increasing of the thermal conductivity of the "floating" sensor membrane and the cavity 4 and the conductivity of the thermopile reduces the sensitivity, in volts per watt, of thermopile 7,8. Also, the infrared absorption efficiency of the IR sensor chip 1 also determines the sensitivity of thermopile 7,8. The Seebeck coefficient of the materials in the thermopile also affect the sensor chip sensitivity. The internal heater 6 and calibration procedure of the present invention can be used to determine the combination of thermal conductivity and Seebeck coefficient for the thermopile. The thermal conductivity and Seebeck coefficient are not independently determined by this measurement. All terms are included in the measured values of Vout while the power is applied. In other words, Vout includes the effects of the thermal conductivity and the Seebeck coefficient and the number of thermopile junctions. The only remaining term which needs to be calibrated "in the field" is the IR absorption, and if the absorber material properties are sufficiently small (±5%), then no field calibration will be required. However, if prior art "laboratory" calibration techniques are used, then a significant amount of calibration range will be necessary in order to obtain the required sensor performance. There can be a variation of +−20% in thermal conductivity, which will need to be taken into account by the calibration. The amount of expected variation in IR absorption is +−5%.

Figure 5:
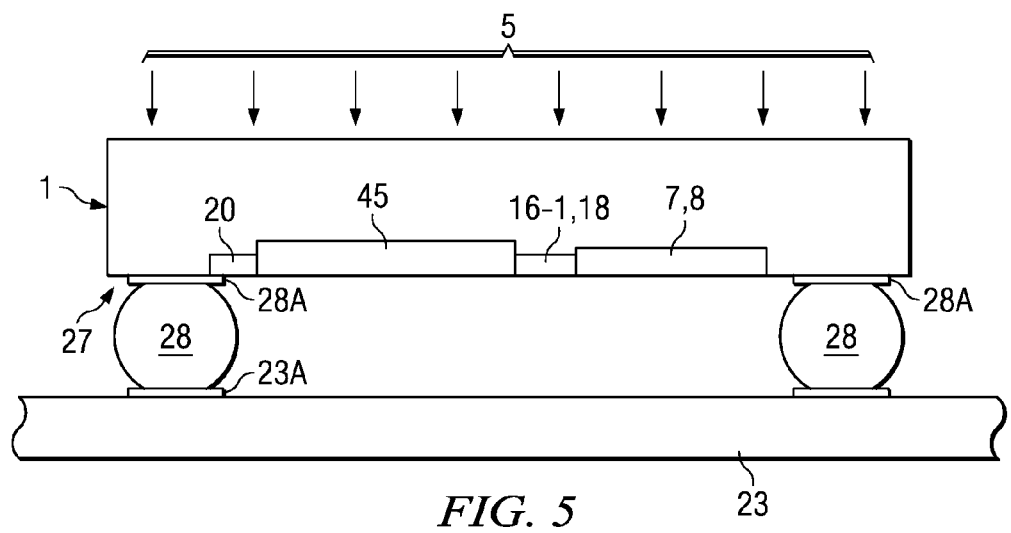
FIG. 5 is a schematic section view diagram of the CMOS-processing-compatible IR sensor of FIG. 3A implemented in a WCSP (Wafer Chip Scale Package).

FIG. 5 shows a partial section view including an IR sensor device 27 which includes above described IR sensor chip 1 as part of a modified WCSP (Wafer Chip Scale Package), wherein various solder bumps 28 are bonded to corresponding specialized solder bump bonding pads 28A on IR sensor chip 1. The modified WCSP technique indicated in FIG. 5 does not include any encapsulation material on the top surface of IR sensor chip 1, in order to avoid blocking the incident IR radiation 5. (Note that the prior art provides epoxy encapsulation or the like on the top surface of a WCSP-packaged chip. However, this would block IR radiation 5 as shown in FIG. 5. Therefore, no coating or encapsulation that would block IR radiation 5 should be provided on top of IR sensor chip 1 as shown in FIG. 5.) The various solder bumps 28 are also bonded to corresponding traces 23A on a printed circuit board 23. (It is believed that one reason that WCSP packaging for the previously mentioned Du and Lee infrared sensor is that the floating membrane supporting one of the thermopile junctions over the cavity as shown in FIG. 1 of Du and Lee (Prior Art FIG. 1 herein) is far too fragile. The fragility is partly caused by the irregular sizes and spacings of the etchant openings and partly by the thinness of the dielectric layer 3.)

Figure 6:
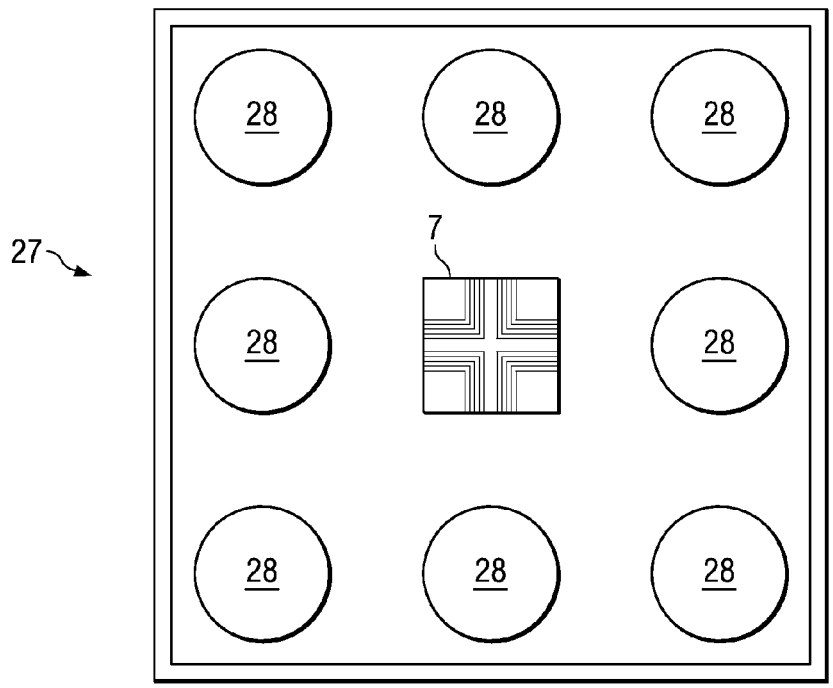
FIG. 6 is a bottom view of the WCSP package as shown in FIG. 5.

FIG. 6 shows a bottom view of the WCSP-packaged IR sensor chip 1 and solder bumps 28. Eight solder bumps 28 are provided as shown along the 4 edges of IR sensor chip 1 (although a conventional WCSP package also includes a centered ninth solder bump). The thermopile membrane in which thermopile junction 7 is supported is located generally in the middle portion of IR sensor chip 1, as indicated by reference 7 in FIG. 6, and is too fragile to support a solder bump, so the typical middle solder bump of a standard WCSP package is omitted from IR sensor device 27. Furthermore, a middle solder bump would tend to act as a thermal short circuit and reduce the responsivity of thermopile 7,8 to the ambient IR radiation to nearly zero.

The bumps or "bump conductors" 28 may be composed of lead-tin or gold-tin, and are bonded to the active surface of IR sensor chip 1 to form IR sensor device 27 as a WCSP packaged chip. (Somewhat different bonding pad configurations are used on integrated circuit chips if bump conductors are to be formed on the bonding pads, in order to accommodate the bump conductors.) The solder bump bonding pads typically are 300µ in diameter, as apposed to 75µ in diameter for typical wire bonding pads. (Copper plating typically is provided on the solder bump bonding pads to enable solder to wet to the surface.)

The presence of cover plate 34 in FIGS. 3A and 3B, the thickness of which may be comparable to or greater than the thickness of dielectric layer 3, substantially strengthens the floating membrane portion of dielectric stack 3. Without the previously mentioned small, circular etchant openings 24 and the strong, relatively thick cover plate 34, the WCSP packaging of the IR sensor chips shown in FIGS. 3A and 3B is impractical.

Figure 7A:
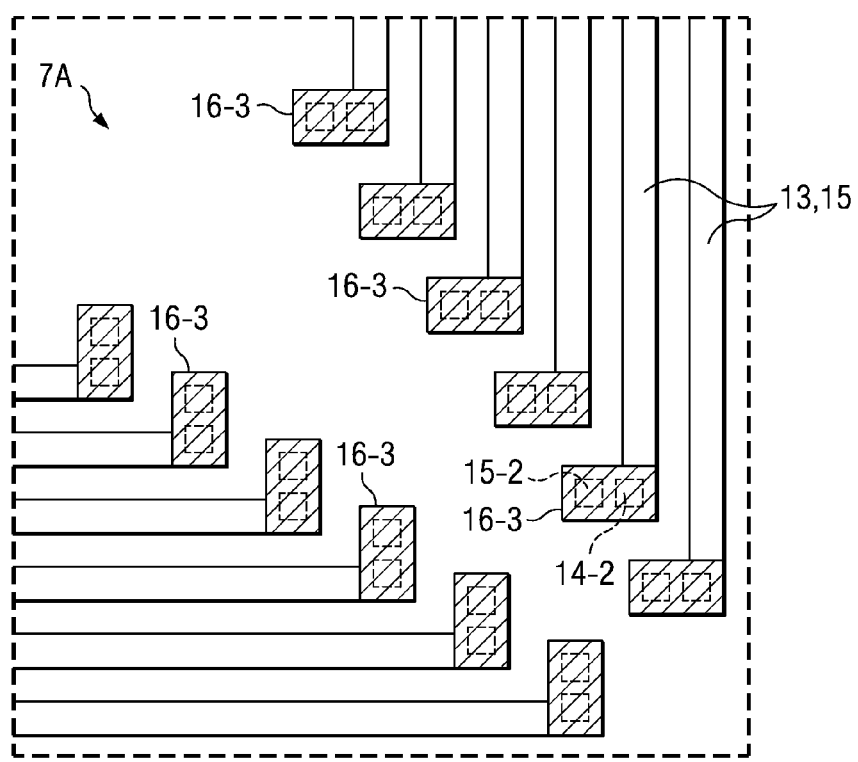
FIG. 7A is a generalized plan view illustrating the layout approach of the thermopiles in details 7 and 8 in FIG. 3A.

FIG. 7A is a partial plan view wherein reference numeral 7A shows the layout of a few of the polysilicon traces 13 and titanium nitride traces 15 of which multiple thermopile junctions 7 are composed. The titanium nitride traces 13 are located directly over polysilicon traces 15, as shown in FIG. 3A. Trace 16-3 of the M1 metallization layer connects tungsten vias 14-2 and 15-2 in FIG. 7A, as also shown in FIG. 3A.

Figure 7B:
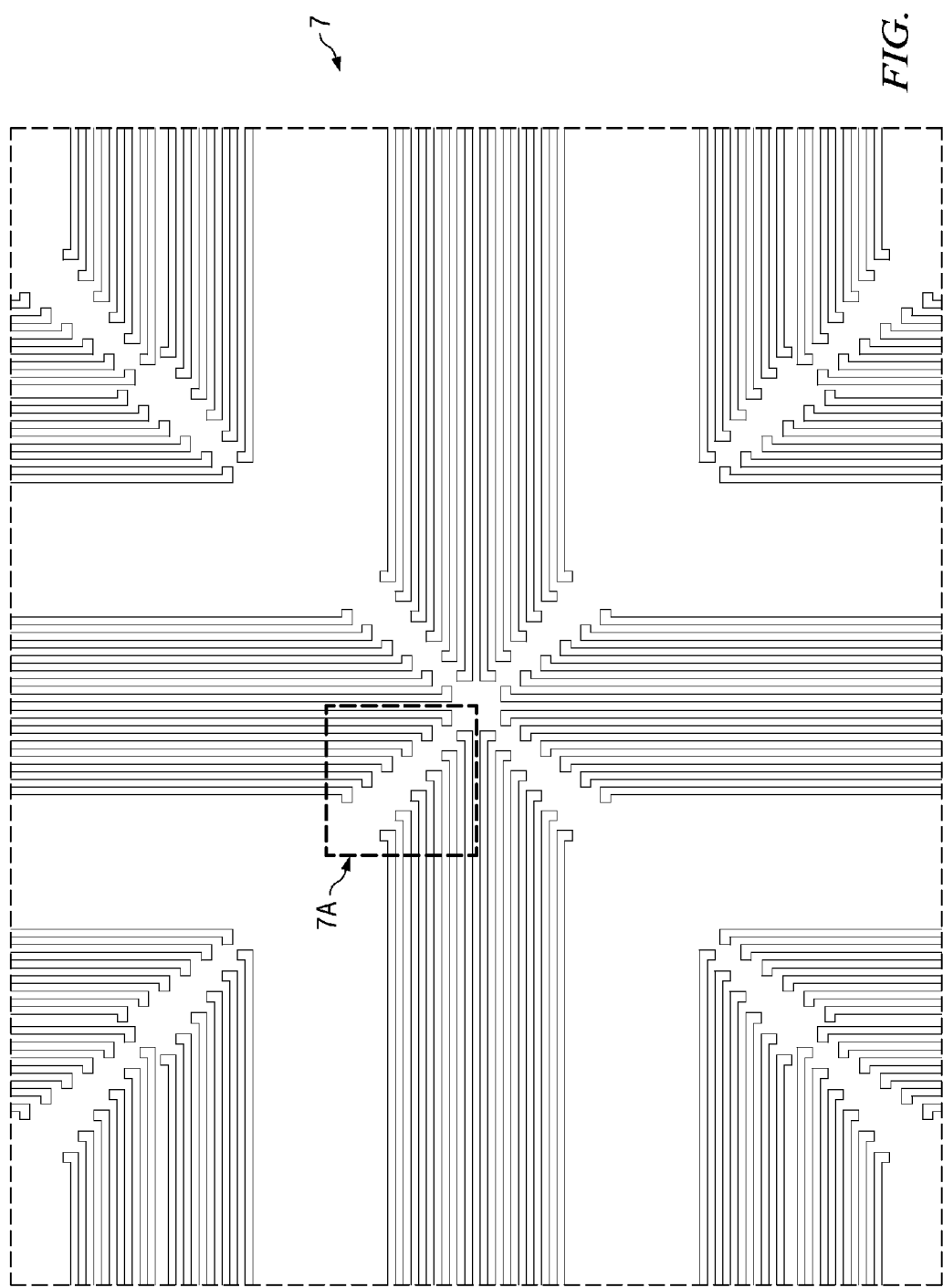
FIG. 7B is an enlarged plan view of thermopiles in details 7 and 8 as shown in FIG. 6.

FIG. 7B shows an expanded view including the portion 7A of thermopile junction 7 appearing in the area designated by reference numeral 7 shown in FIG. 6.

Figure 8:
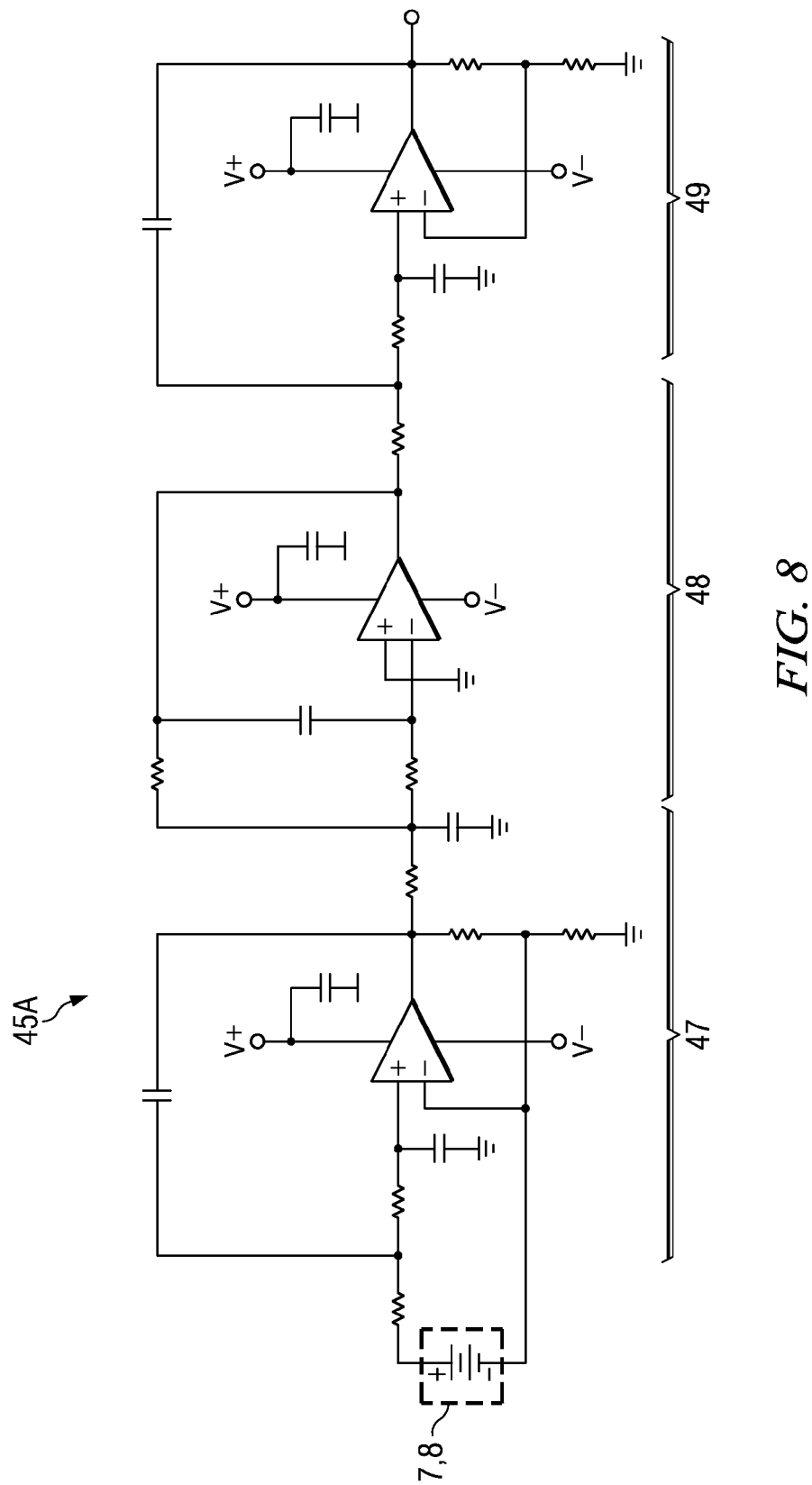
FIG. 8 is a schematic view of an analog gain/filter circuit which can be included in CMOS circuitry block 45 of FIG. 3A.

FIG. 8 is a schematic diagram of a thermopile gain/filter circuit 45A which can be included in block 45 in FIGS. 3A and 3B. In FIG. 8, gain/filter circuit 45A includes an input amplifier stage 47, a filter stage 48, and an output stage 49. This circuitry, which is conventional in IR sensor devices, provides an analog technique for converting a low level, high impedance input voltage to a high level, low impedance output voltage. The input impedance typically is between 1 megohm and 40 megohms. The signal Vout produced by thermopile 7,8 can be from about a microvolt to a millivolt, and typically needs to be amplified by at least 1000. The filtering provided by gain/filter circuit 45A is desirable because a typical temperature measurement of an IR radiation source occurs at a very low frequency close to DC (e.g., less than about 10 Hz). Gain/filter amplifier 45A filters out high-frequency noise, to thereby provide an improved signal-to-noise ratio of IR sensor chip 1. (Note however, that this does not decrease the inherent noise in the IR sensor itself. The inherent noise of the IR sensor is a function of the sensor resistance.

Figure 9A:
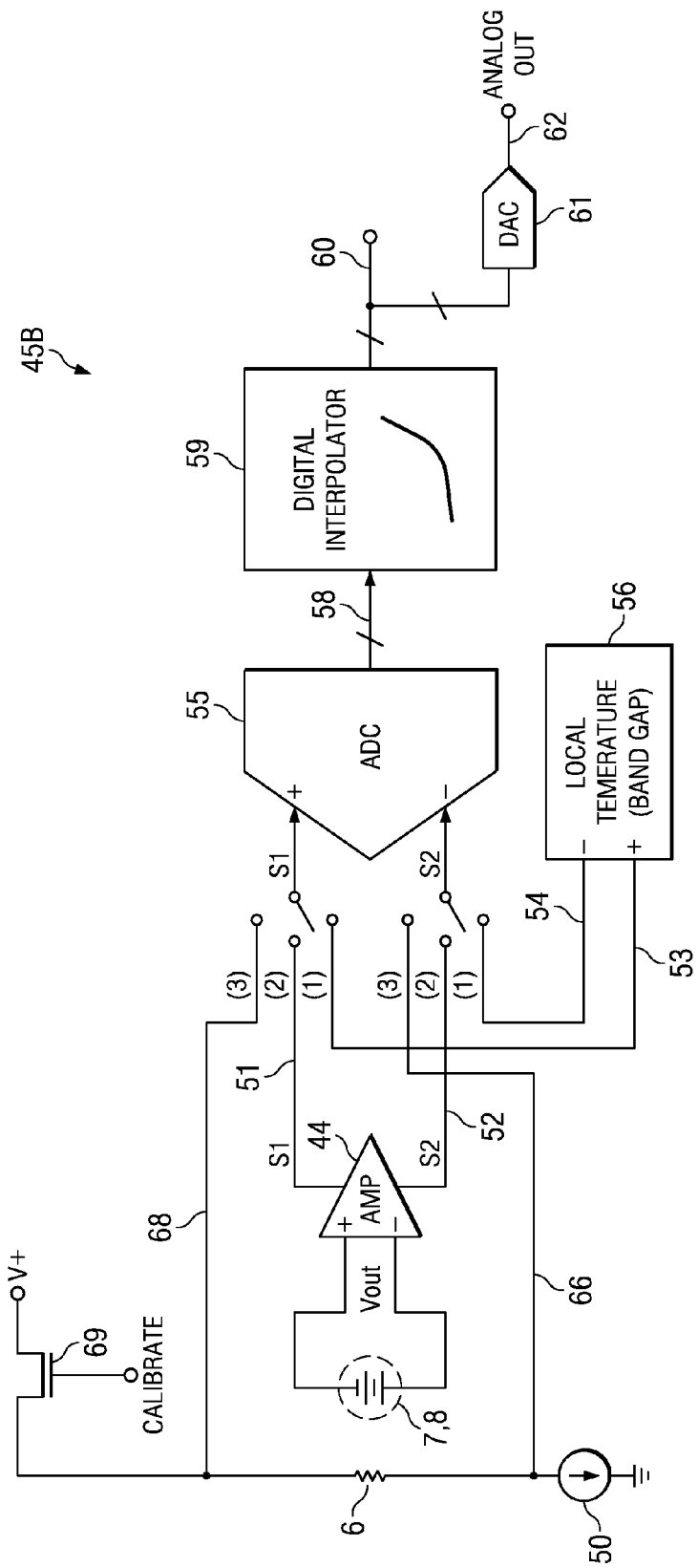
FIG. 9A is a diagram of digital signal processing circuitry that can be included in block 45 of FIG. 3A and internal responsivity calibration structure and circuitry that can be included in block 67 of FIG. 3B.

Alternatively, CMOS circuitry in block 45 in FIG. 3A may include part or all of the circuitry shown in FIG. 9A. Referring to FIG. 9A, a simple, high input impedance amplifier 44 has its (+) and (−) inputs connected to receive the thermoelectric voltage Vout produced by thermopile 7,8. Output 51 of amplifier 44 is connected to one terminal of switch S1, the pole terminal of which is connected to one input of analog-to-digital converter (ADC) 55, which may be a conventional delta sigma ADC. Similarly, output 52 of amplifier 44 is connected to one terminal of switch S2, the pole terminal of which is connected to another input of ADC 55. Another terminal of switch S1 is connected to one input of a local temperature measurement circuit 56, and another terminal of switch S2 is connected to the other input of local temperature measurement circuit 56. Switches S1 and S2 sequentially sample amplifier output 2 and the local temperature (i.e., the temperature of substrate 2) into ADC 55 for conversion, and those results are input via bus 58 to digital interpolator 59

Figure 9B:
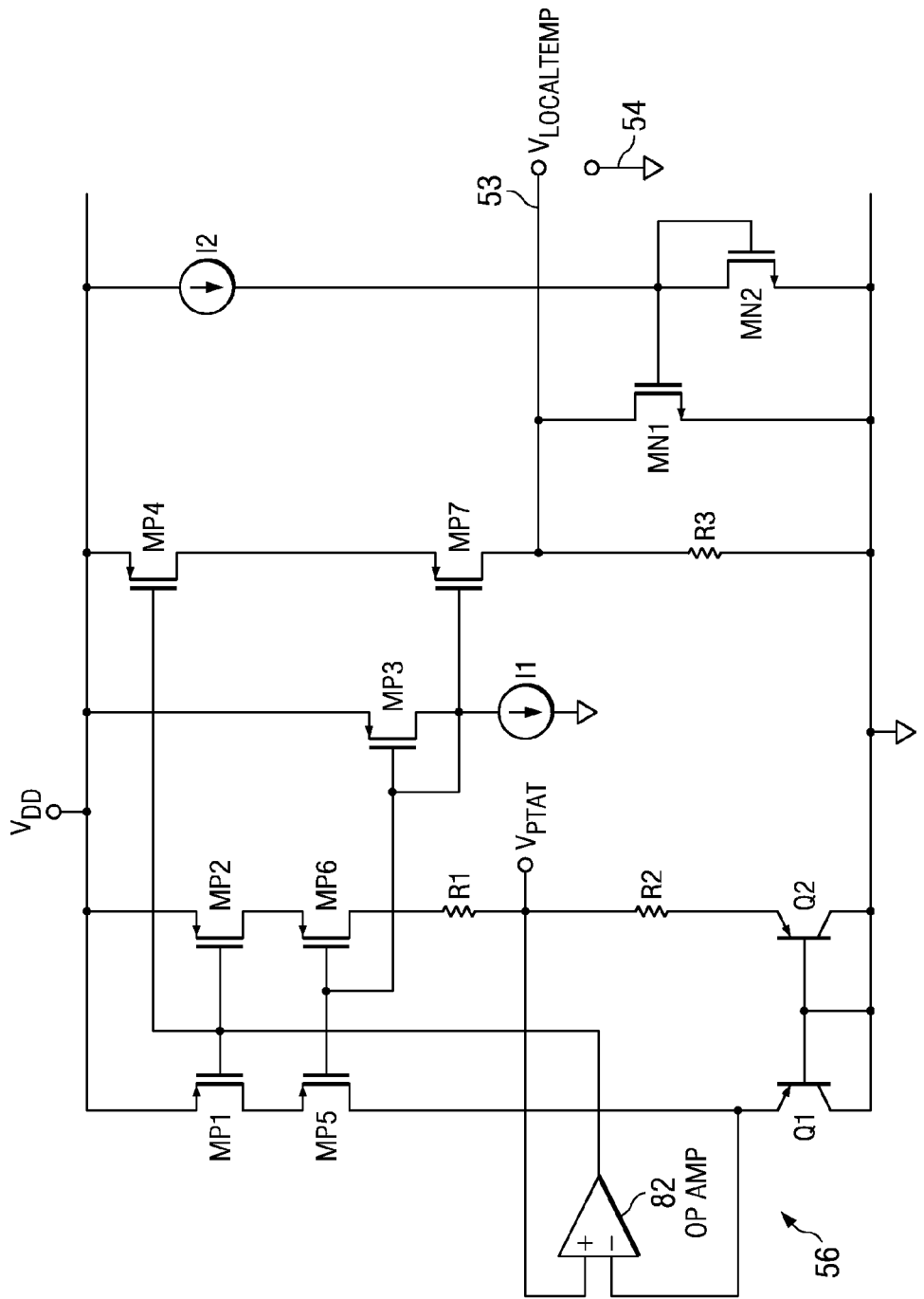
FIG. 9B is a schematic diagram of circuitry in block 56 of FIG. 9A.

Digital interpolator 59 produces a linearized digital output signal that represents the temperature of the remote IR source sensed by thermopile 7,8. Local temperature measurement circuit 56 is based on a conventional bandgap circuit, one implementation of which is shown in FIG. 9B.

Digital interpolator circuit 59 may be implemented in various well-known ways, for example by means of a digital signal processor (DSP) as indicated on page 10 of the July, 2008 datasheet for the MLX90614 family of IR sensors marketed by Melexis Microelectronic Integrated Systems. Alternatively, digital interpolator circuit 59 may be implemented by means of a lookup table stored in a read-only memory (ROM). The values stored in the read-only memory can be determined generally in accordance with the following analysis and equations.

The local temperature measurement exploits the well known $V_{BE}$ characteristics of bipolar transistors. The ADC 55 in FIG. 9A compares a voltage proportional to the absolute temperature $V_{PTAT}$ to a reference voltage $V_{REF}$ which is constant with temperature. The local temperature circuit 56 in FIG. 9A and shown in detail in subsequently described FIG. 9B performs this function to generate a voltage representative of the foregoing absolute temperature T. The ratio of these two voltages provides the absolute temperature T. The PTAT (proportional to absolute temperature) voltage is the difference between two base-emitter voltages of bipolar transistor operating with dissimilar current densities:

$$V_{PTAT} = kT/q \ln(mn) \quad \text{Eq. 1.0}$$

Here, m is the transistor emitter area ratio and n is the current ratio in the PTAT circuitry. The base-emitter voltage of a bipolar transistor is:

$$V_{BE}(T, I_C) = \quad \text{Eq. 1.1}$$
$$E_g - \frac{T}{T_0}(E_g - V_{BE,0}) + \frac{kT_0}{q} \times \frac{T}{T_0} \ln\left(\frac{I_C(T)}{I_C(T_0)}\right) - \eta \frac{kT}{q} \ln\left(\frac{T}{T_0}\right)$$

The bandgap $E_g$ of silicon, the curvature $\eta$ and reference temperature $T_0$ are constants, and the only variable parameter that needs to be compensated for is the base-emitter voltage $V_{BE,0}$ at the reference temperature $T_0$. It can be shown that a linear combination of $V_{BE}$ and $V_{PTAT}$ is approximately constant with a very small residual curvature:

$$V_{REF} = \alpha V_{PTAT} + V_{BE} \quad \text{Eq. 1.2}$$

The gain coefficient $\alpha$ is trimmed in-circuit to compensate for the variation of the initial base-emitter voltage. The ADC 55 in FIG. 9A therefore measures the ratio $$\frac{V_{PTAT}}{V_{REF}} = \frac{V_{PTAT}}{\alpha V_{PTAT} + V_{BE}} = \frac{\frac{kT}{q}\ln(mn)}{V_{REF}} \propto T \quad \text{Eq. 1..3}$$

The gains in the ADC implementation are selected in such a way that the digital number representing the above ratio (the average value of the bit stream in a sigma delta ADC) can easily be converted in degrees Celsius.

The radiative heat transfer between the $SiO_2$ thermopile membrane and the measured object is governed by Stefan-Boltzmann's law. In above described embodiments of the invention, the silicon substrate 2 used for the WCSP package and also used as the visible light filter separates the infrared-sensitive membrane and the IR-emitting object of interest. This creates multiple reflections. The IR membrane is separated by from the IR-emitting object of interest by silicon substrate 2, which is a solid shield. The total power absorbed or emitted by the thermopile 7,8 per unit area is given by the following expression:

$$S_{12} = \left(\frac{1}{\frac{1}{\varepsilon_1} + \frac{1}{\varepsilon_2} + \frac{1}{\tau} - 2}\right)\sigma(T_1^4 - T_2^4) \quad \text{Eq. 1.4}$$

where T2 is the surface temperature of the thermally isolated portion of the $SiO_2$ membrane 3, T1 is the temperature of the remote IR-emitting object of interest, $\in 2$ and $\in 1$ are the emissivities of the sensing thermopile membrane and the IR-emitting object, respectively, $\tau$ is the infrared transmission of the silicon substrate 2, and $\sigma$ is Stefan-Boltzmann's constant. The voltage output $V_{tp}$ of the thermopile 7,8 is proportional to its area $A_{sensor}$ and responsivity $\Re$:

$$V_{tp} = A_{sensor} \Re(T_2)\left(\frac{1}{\frac{1}{\varepsilon_1} + \frac{1}{\varepsilon_2} + \frac{1}{\tau} - 2}\right)\sigma(T_1^4 - T_1^4) \quad \text{Eq. 1.5}$$

The built-in ADC 55 is used to measure $V_{tp}$ and the local temperature T2 and to calculate the temperature T1 of the remote IR-emitting object using the previously calibrated responsivity $\Re$ and the constants $\in 1, \in 2, \tau,$ and $\sigma$, according to the following expression:

$$T_1 = \sqrt[4]{\frac{V_{tp}}{A_{sensor}\Re(T_2)\left(\frac{1}{\frac{1}{\varepsilon_1} + \frac{1}{\varepsilon_2} + \frac{1}{\tau} - 2}\right)\sigma} + T_2^4} \quad \text{Eq. 1.6}$$

Since equation (1.6) is not easy to calculate directly in a small size IR sensor implementation without digital floating point math capabilities, a series of look-up tables and interpolations can be readily used to reduce the IR sensor area and power consumption. The look-up table values can be readily pre-calculated and stored in read-only memory (ROM).

The "linearized" digital output produced on bus 60 by digital interpolator 59 can be utilized internally or externally as desired for various applications. If a corresponding analog output signal is desired, it can be obtained by applying the digital output signal on bus 60 to the input of a digital-to-analog converter (DAC) 61, which generates the desired analog output signal on conductor 62. For example, the analog output signal on conductor 62 could be used in an analog control loop in which the temperature is required as an input. The digital output signal on bus 60 could be used in an application in which the remote temperature value must be provided as an input to a computer.

Note that amplifier 44 does not include a filter because a filtering function (related to the sample frequency and the duration of each input sampling process) is inherently built into delta-sigma ADC 5. The precision of the IR sensing operation is determined by the delta-sigma conversion process.

The above mentioned linearization of the delta-sigma ADC output generated on bus 58 by digital interpolator circuit 59 in FIG. 9A is necessary because, as indicated in the foregoing analysis, the infrared energy absorbed by thermopile 7,8 is proportional to the fourth power of the temperature of the remote body the temperature of which is being measured, and therefore is very nonlinear with respect to temperature. The linearization process also is required in order to obtain the digital representation on bus 60 of the temperature of the remote IR source in degrees, rather than as a voltage. Alternatively, the linearization could be accomplished using analog circuitry, but that would be less accurate, and would require substantially more circuitry (because high gain, offset compensation, and offset drift compensation would be required). As a practical matter, these problems using analog circuitry for the linearization would reduce the accuracy of the IR sensing.

An accurate value of the local temperature, i.e., the temperature of thermopile 7, 8 is required to calculate the remote temperature of the source of the IR radiation 5. The difference between remote temperature and the local temperature determines the amount of power absorbed by thermopile 7,8.

In the described embodiments of the invention, the conventional linearizing/interpolation procedure utilized can include selecting values from ROM look-up tables in digital interpolator circuit 59. Each look-up table contains values which are functions of the thermoelectric voltage Vout generated by thermopile 7,8. A separate table is provided for each of a number of values of the local temperature, respectively. The appropriate look-up table is selected according to the present value of the local temperature, and then a value from the selected look-up table is selected corresponding to the present value of the thermopile output voltage Vout.

FIG. 9B shows a schematic drawing of a well known implementation of local temperature circuit 56 in FIG. 9A. In FIG. 9B, local temperature circuit 56 includes an operational amplifier 82 having its (−) input connected to the emitter of a PNP transistor Q1, the base and collector of which are connected to ground. The (+) input of amplifier 82 is connected to a junction between resistors R1 and R2, the other terminal of resistor R2 being connected to the emitter of PNP transistor Q2, the base and collector of which are connected to ground. The other terminal of resistor R1 is connected to the drain of P-channel transistor MP6, the source of which is connected to the drain of P-channel transistor MP2. The gate of transistor MP2 is connected to the output of amplifier 82, the gate of P-channel transistor MP1, and the gate of P-channel transistor MP4. The sources of transistors MP1, MP2, MP3, and MP4 are connected to $V_{DD}$. The gate of transistor MP6 is connected to the gates of P-channel transistors MP5, MP3, and MP7. The source and drain of transistor MP5 are connected to the source of transistor MP1 and the emitter of transistor Q1, respectively. The drain of transistor MP3 is connected to its gate and a current source I1. The source of transistor MP7 is connected to the drain of transistor MP4. The drain of transistor MP7 is connected by conductor 53 to one terminal of resistor R3 and to the drain of N-channel transistor MN1, the source of which is connected to ground. The gate of transistor MN1 is connected to the gate and drain of a diode-connected N-channel transistor MN2, the source of which is connected to ground. The other terminal of resistor R3 is connected to ground. A current I2 flows through transistor MN2

In operation, transistors Q1, Q2, MP1, MP2, MP5 and MP6 and resistors R1 and R2 of FIG. 9B operate to generate a proportional-to-absolute-temperature bandgap voltage $V_{PTAT}$ which is applied to the (+) input of amplifier 82. This bandgap voltage is used to generate a local temperature voltage $V_{LOCALTEMP}$ (i.e., T2 in the foregoing analysis) on conductor 53 representing the temperature of silicon substrate 2 (FIG. 3A).

Figure 10E:
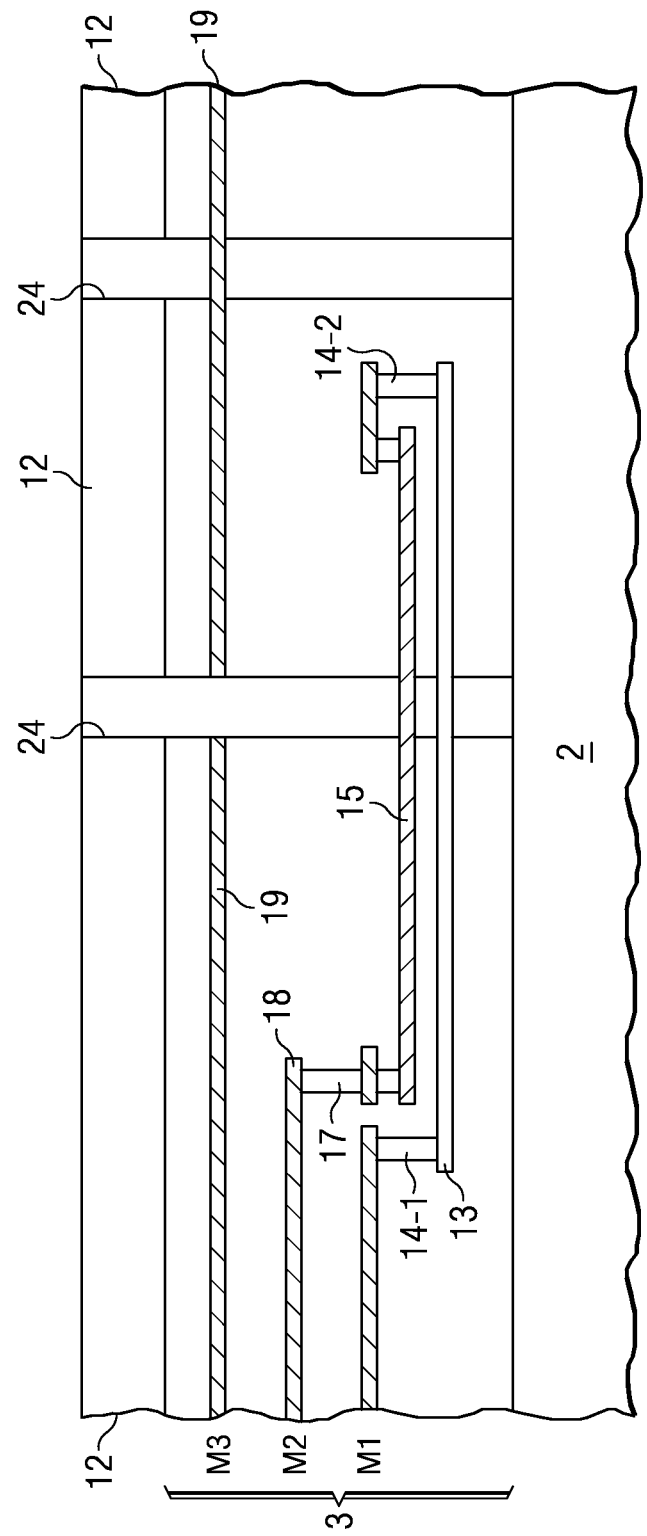

FIGS. 10A-10G show a sequence of section view diagrams of the IR sensor structures generated according to the process for fabricating the IR sensor chip 1 of FIG. 3A. FIG. 10A shows providing an $SiO_2$ layer 3-1 on the upper surface of silicon substrate 2, and then depositing a layer of polysilicon on the upper surface of sublayer 3-1 (see FIG. 3A). The layer of polysilicon then is patterned so as to provide the traces 13 required to fabricate thermopile 7,8, for example in the pattern illustrated in FIG. 7B. Then, as indicated in FIG. 10B, another $SiO_2$ sub-layer (sub-layer 3-2 in FIG. 3A) is deposited on the polysilicon traces 13, and then titanium nitride layer 15 is deposited on that sublayer and then patterned to provide the traces 15 as required to make thermopile 7,8, for example in the pattern illustrated in FIG. 7B. Then suitable via openings are provided through the $SiO_2$ sub-layers 3-2 and 3-3, and tungsten contacts are formed in the via openings. Next, a first metallization layer M1 is deposited on the $SiO_2$ sub-layer 3-2 and patterned as needed to provide connection to the tungsten contacts and any CMOS circuitry (not shown) that also is being formed on infrared sensor chip 1.

Then, as indicated in FIG. 10C, another $SiO_2$ sub-layer 3-4 (FIG. 3A) is deposited on the first metallization M1. Suitable via openings then are formed therein, and tungsten vias are formed in those the openings. Then a second aluminum metallization layer M2 is deposited on $SiO_2$ sub-layer 3-4 and patterned as necessary to complete the formation of thermopile 7,8 and also to make connections that are required for any CMOS circuitry also being formed. Next, as indicated in FIG. 10D, another $SiO_2$ sub-layer 3-5 is deposited on the aluminum metallization M2. A third aluminum metallization layer M3, also designated by reference numeral 19, is formed on sub-layer 3-5 and patterned as needed. Then a final dielectric sub-layer 3-6 is deposited on the M3 metallization to complete the structure of $SiO_2$ dielectric stack 3. Then, a silicon nitride passivation layer 12 is formed on dielectric sub-layer 3-6 (FIG. 3A).

Figure 10F:
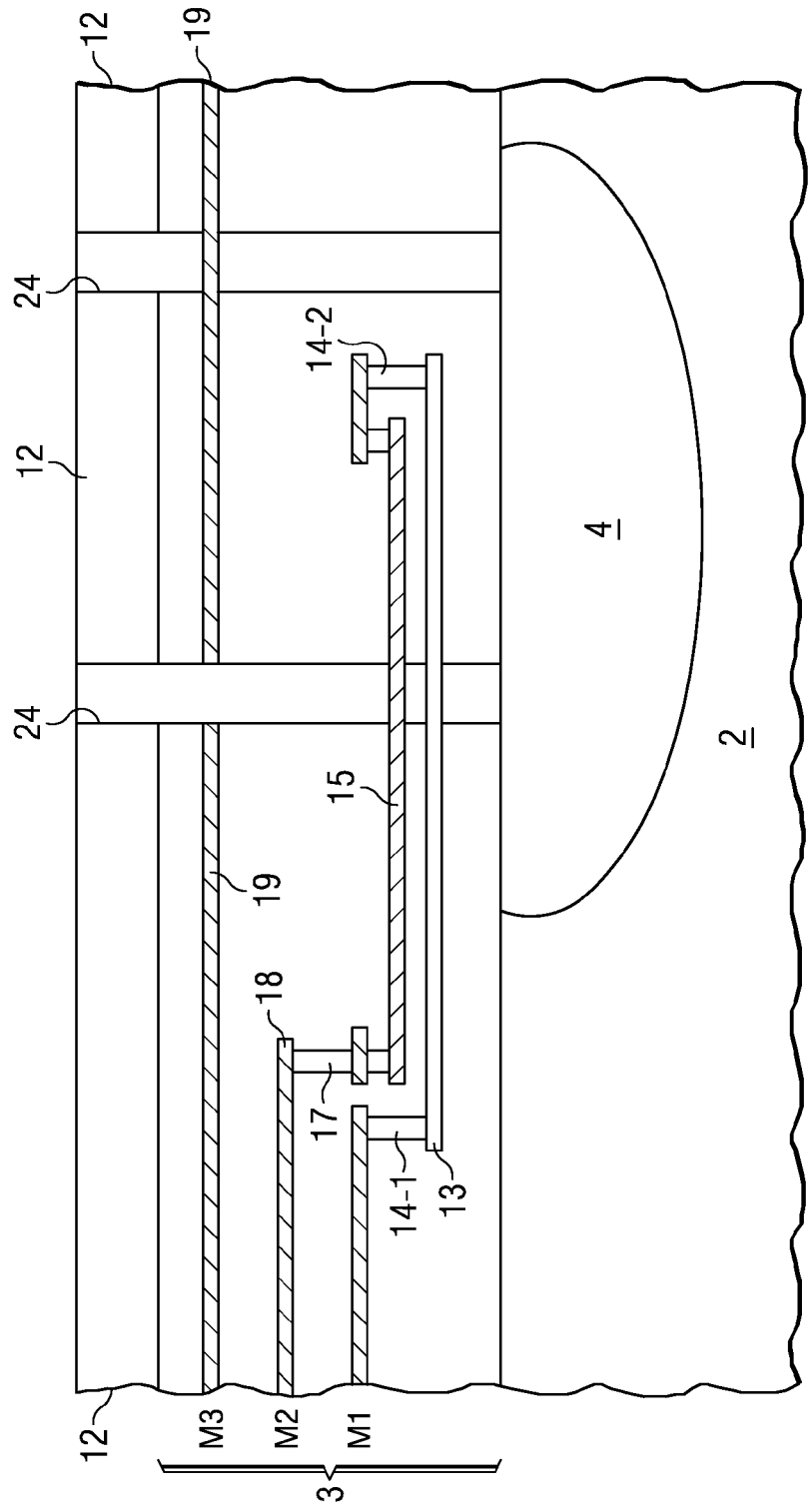
Figure 10G:
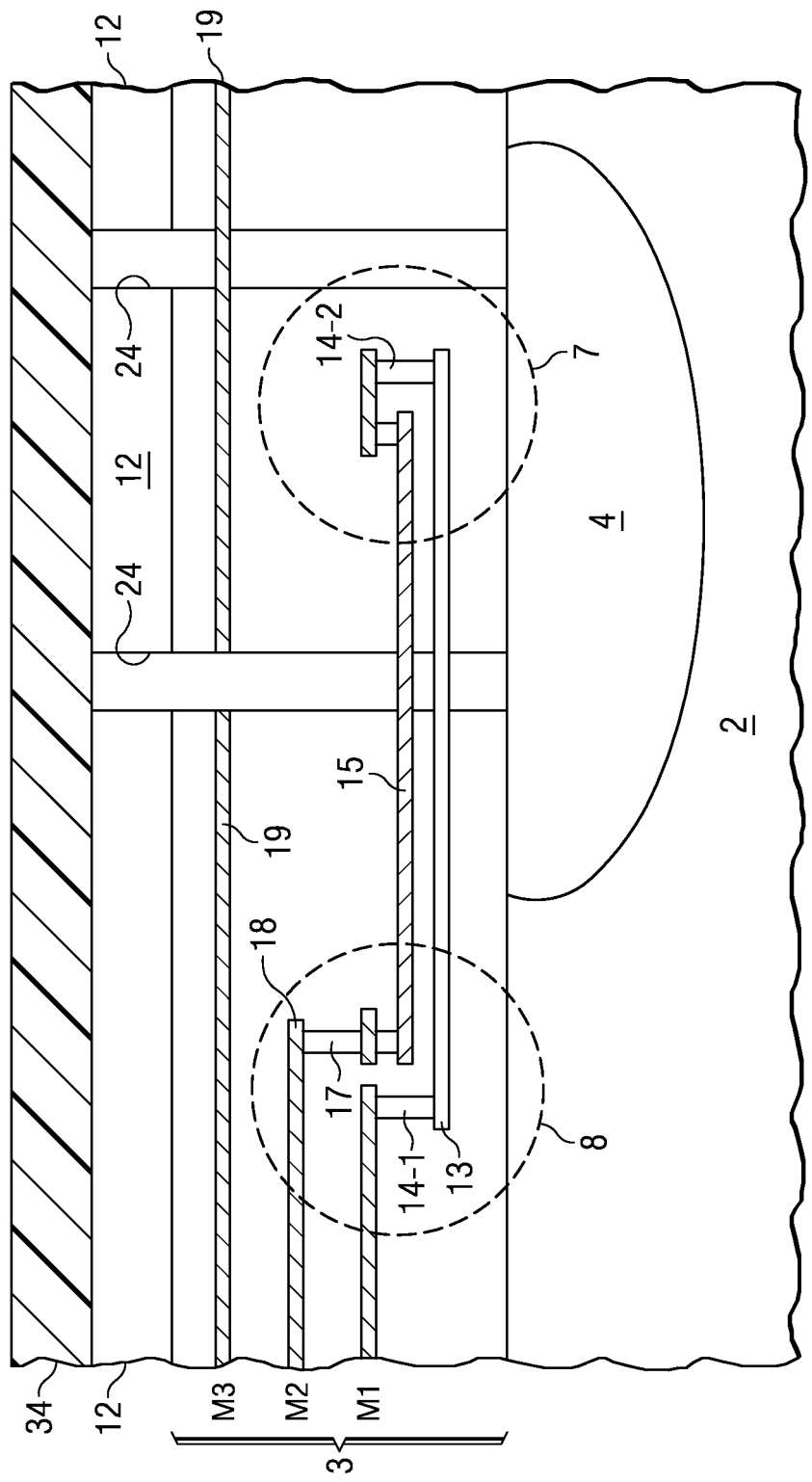

Next, as indicated in FIG. 10E, silicon etchant openings 24 are formed, extending from the upper surface of silicon substrate 2 to the top surface of passivation layer 12. Then, as indicated in FIG. 10F, a conventional isotropic silicon etchant is introduced into etchant openings 24 in order to etch cavity 4 in the upper surface of silicon substrate 2 so that cavity 4 has a shape determined by the locations of the various etchant openings 24. The portion of thin dielectric stack 3 containing etchant openings 24 and thermopile junction 7 thus becomes a more robust "floating" thermopile membrane which is thermally isolated by cavity 4 from silicon substrate 2. Finally, as indicated in FIG. 10G, a relatively thick roll-on epoxy film or other suitable permanent cap layer 34 is provided on the upper surface of silicon nitride passivation layer 12 in order to permanently seal cavity 4 and etchant openings 24 and substantially strengthen the "floating" portion of dielectric membrane 3. This is desirable, because during subsequent wafer sawing operations, a very vigorous water stream impinges on the surface of IR sensor chip 1, and would tend to crush the "floating" thermopile membrane over cavity 4. Cap layer 34 also prevents silicon residue generated by the wafer sawing operations from entering cavity 4.

Thus, the above described embodiments of the invention use the silicon substrate 2 of IR sensor chip 1 in the WCSP package configuration 27, as shown in FIG. 5, as both a protection window and a visible light filter. The sizes, shape, and number of etchant openings 24 are selected to optimize the strength of the "floating" thermopile membrane above cavity 4, and thereby result in a more robust IR radiation sensor device. Finally, the epoxy cover plate 34 preferably is placed over the sensor to seal cavity 4 and strengthen the "floating" membrane portion of dielectric layer 3 containing thermopile junction 7. This is in contrast to the prior art, which uses expensive hermetic packages with special silicon windows or windows with baffles to prevent stray visible light from entering the sensor package.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the basic theory of operation of the above described embodiments of the invention is not necessarily limited to IR radiation wavelengths, although absorber material of (or associated with) the thermopiles might have to be changed to a different material that is more capable of absorbing ambient radiation of wavelengths other than infrared wavelengths. For shorter wavelengths, e.g., visible UV wavelengths, the impinging radiation to be measured would need to impinge on the bottom of the integrated circuit chip structure as shown in FIG. 2 because the silicon does not allow the transmission of visible light. (In the described embodiments of the invention, the polysilicon traces 13 function well as IR energy absorbers.) Cavity 4 can contain a vacuum, or gas, or other material having low thermal conductivity.

As another example, although FIG. 5 indicates the silicon substrate 2 on top and the $SiO_2$ dielectric stack 3 on the bottom, in another implementation of the invention, the IR sensor chip can be in a WCSP package configuration with the silicon substrate 2 facing downward to receive the IR radiation to be measured. In this case, conductive vias can be provided which extend from active circuitry on the front side of the chip through the substrate 2 to make electrical connection to solder bumps bonded to the back surface of silicon substrate 2. The bump conductors 28 could be copper studs instead of solder bumps. It should be appreciated that is especially important to the objective of achieving low cost and good performance of an IR sensor device of the present invention to provide a direct connection of the IR sensor chip 1 to a PC board without providing any packaging material surrounding the chip. Also, it may be economic or practical to provide only the thermopiles on the IR sensor chip and provide all amplification and other signal processing on a different chip or chips.

What is claimed is:

1. A radiation sensor device comprising:
   an integrated circuit radiation sensor chip including first and second thermopile junctions connected in series to form a thermopile within a dielectric stack of the radiation sensor chip, the first thermopile junction being more thermally insulated from a substrate of the radiation sensor chip than the second thermopile junction;
   a plurality of bonding pads on the radiation sensor chip coupled to the thermopile; and
   a plurality of bump conductors bonded to the bonding pads, respectively, for physically and electrically connecting the radiation sensor chip to conductors on a printed circuit board, wherein no chip coating material blocks radiation to be sensed by the radiation sensor device.

2. The radiation sensor device of claim 1 wherein the first thermopile junction is insulated from the substrate by means of a cavity between the substrate and the dielectric stack.

3. The radiation sensor device of claim 2 wherein the dielectric stack is a semiconductor process dielectric stack including a plurality of $SiO_2$ sublayers and polysilicon traces, titanium nitride traces, tungsten contacts, and aluminum metallization traces between the sublayers patterned to provide the first and second thermopile junctions connected in series to form the thermopile.

4. The radiation sensor device of claim 3 wherein the semiconductor process dielectric stack is a CMOS process dielectric stack.

5. The radiation sensor device of claim 3 wherein each of the first and second thermopile junctions is composed of a plurality of thermopile junctions connected in series, respectively.

6. The radiation sensor device of claim 5 further comprising CMOS circuitry coupled between first and second terminals of the thermopile to receive and operate upon a thermoelectric voltage generated by the thermopile in response to infrared (IR) radiation received by the radiation sensor chip, the CMOS circuitry also being coupled to the bonding pads.

7. The radiation sensor device of claim 6 further comprising a gain and filter circuit which amplifies and filters the voltage produced between the first and second terminals.

8. The radiation sensor device of claim 6 further comprising an amplifier having an input selectively coupled to receive the voltage and an output of a local temperature circuit, the amplifier having an output coupled to an input of a delta-sigma analog-to-digital converter, the delta-sigma analog-to-digital converter having an output coupled to an input of a digital interpolator for linearizing an output signal produced by the delta-sigma analog-to-digital converter.

9. The radiation sensor device of claim 3 wherein the substrate is composed of silicon to pass infrared radiation to the thermopile and block visible radiation, and further including a passivation layer disposed on the dielectric stack, a plurality of circular etchant openings located between one or more of the polysilicon traces, the titanium nitride traces, or the aluminum metallization traces and extending through the passivation layer and the dielectric layer to the cavity for introducing silicon etchant to produce the cavity by etching the silicon substrate.

10. The radiation sensor device of claim 9 further comprising a cap layer on the passivation layer to cover the etchant openings to protect the cavity from contamination and to reinforce a portion of the dielectric stack spanning the cavity.

11. The radiation sensor device of claim 10 wherein the passivation layer is composed of silicon nitride and the cap layer is composed of roll-on epoxy film material and is of substantially greater thickness than the dielectric stack.

12. The radiation sensor device of claim 9 wherein diameters of the etchant openings are in a range from approximately 10 to 20 microns and wherein spacings between the etchant openings are in a range from approximately 10 to 60 microns.

13. The radiation sensor device of claim 1 wherein the bump conductors are composed of lead-tin.

14. A method for making a radiation sensor device, comprising:
    providing first and second thermopile junctions connected in series in a dielectric stack of a radiation sensor chip to form a thermopile, and thermally insulating the first thermopile junction from a substrate of the radiation sensor chip;
    forming a plurality of bonding pads on the radiation sensor chip, the bonding pads being coupled to the thermopile; and
    bonding a plurality of bump conductors to the bonding pads, respectively, to physically and electrically connect the radiation sensor chip to conductors on a printed circuit board.

15. The method of claim 14 further comprising insulating the first thermopile junction from the substrate by etching a cavity in the substrate between the first thermopile junction and the substrate.

16. The method of claim 15 further comprising coupling the thermopile between first and second terminals of CMOS circuitry included in the radiation sensor chip for receiving and operating upon a thermoelectric voltage generated by the thermopile in response to radiation received by the sensor chip.

17. The method of claim 16 wherein the dielectric stack is a CMOS process dielectric stack including a plurality of $SiO_2$ sublayers and polysilicon traces, titanium nitride traces, tungsten contacts, and aluminum metallization traces between the sublayers patterned to provide the first and second thermopile junctions connected in series, and wherein the substrate is composed of silicon,
    the method further comprising forming a passivation layer on the dielectric stack, forming a plurality of etchant openings located between one or more of the polysilicon traces, the titanium nitride traces, or the aluminum metallization traces and extending through the passivation layer and the dielectric layer to the cavity, introducing silicon etchant through the etchant openings to etch the cavity into the substrate, and forming a cap layer on the passivation layer to cover the etchant openings to protect the cavity from contamination and to reinforce a portion of the dielectric stack spanning the cavity by rolling epoxy film material onto the passivation layer, the cap layer being sufficiently thick and strong to substantially reinforce the portion of the dielectric stack spanning the cavity.

18. The method of claim 17 further comprising providing a gain and filter amplifier circuit which amplifies and filters the output voltage produced between the first and second terminals in the CMOS circuitry.

19. A radiation sensor device, comprising:
    a radiation sensor chip including first and second thermopile junctions connected in series in a dielectric stack of the radiation sensor chip to form a thermopile;
    means for thermally insulating the first thermopile junction from a substrate of the radiation sensor chip; and bump conductor means bonded to a plurality of bonding pads coupled to the thermopile, respectively, for physically and electrically connecting the radiation sensor chip to conductors of a printed circuit board.

* * * * *